United States Patent
Schultz et al.

(10) Patent No.: US 10,164,732 B2
(45) Date of Patent: Dec. 25, 2018

(54) ENCODING CIRCUIT, METHOD FOR TRANSMITTING DATA OVER A DATA BUS, AND RADIO COMMUNICATION DEVICE

(71) Applicant: Intel IP Corporation, Santa Clara, CA (US)

(72) Inventors: Christoph Schultz, Essen (DE); William Dawson Kesling, Davis, CA (US); Eytan Mann, Modiin (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/748,293

(22) Filed: Jun. 24, 2015

(65) Prior Publication Data

US 2016/0380721 A1 Dec. 29, 2016

(51) Int. Cl.

| | |
|---|---|
| *H04L 25/03* | (2006.01) |
| *H04L 1/00* | (2006.01) |
| *H04L 25/02* | (2006.01) |
| *H04L 25/49* | (2006.01) |
| *H04B 1/04* | (2006.01) |
| *H03K 19/003* | (2006.01) |
| *H04B 3/32* | (2006.01) |
| *H04L 25/08* | (2006.01) |

(52) U.S. Cl.
CPC .......... *H04L 1/0011* (2013.01); *H04L 1/0033* (2013.01); *H04L 25/0276* (2013.01); *H04L 25/49* (2013.01); *H03K 19/00346* (2013.01); *H04B 1/0475* (2013.01); *H04B 3/32* (2013.01); *H04L 25/08* (2013.01)

(58) Field of Classification Search
CPC ..... H04L 1/0011; H04L 1/0033; H04L 25/08; H04L 25/0276; H04L 25/49; H04B 1/0475; H04B 3/32; H04B 1/12; H03K 19/00346; H04J 1/12
See application file for complete search history.

(56) References Cited

U.S. PATENT DOCUMENTS 6,463,103 B1 * 10/2002 Dong ................... H04B 14/04
  375/242
6,925,112 B1 * 8/2005 Morejon ............. H04L 25/0228
  375/222

(Continued)

FOREIGN PATENT DOCUMENTS

WO 2013048537 A1 4/2013

OTHER PUBLICATIONS

Wikipedia article "Spectral Density", Nov. 2013, pp. 1-9.*

(Continued)

*Primary Examiner* — Sophia Vlahos
(74) *Attorney, Agent, or Firm* — Viering, Jentschura & Partner mbB

(57) ABSTRACT

An encoding circuit for selecting a transmit data symbol for transmission over a data bus may include an alternate symbol generation circuit configured to generate an alternate data symbol based on an encoded data symbol scheduled for transmission over the data bus and a decision circuit configured to select the encoded data symbol or the alternate data symbol as the transmit symbol based on a plurality of phasors. The decision circuit may include a plurality of phasor generation circuits configured to generate the plurality of phasors based on the encoded data symbol and a plurality of target frequencies.

29 Claims, 11 Drawing Sheets

(56) References Cited

U.S. PATENT DOCUMENTS

| | | | |
|---|---|---|---|
| 7,142,021 B2* | 11/2006 | Park | H03K 19/00361 |
| | | | 326/104 |
| 8,451,913 B2* | 5/2013 | Oh | H04L 25/4915 |
| | | | 375/257 |
| 2004/0156444 A1* | 8/2004 | Nakache | H04B 1/71632 |
| | | | 375/295 |
| 2006/0188001 A1* | 8/2006 | Mo | H04B 1/71632 |
| | | | 375/130 |
| 2009/0323942 A1* | 12/2009 | Sharon | G11C 7/1006 |
| | | | 380/44 |
| 2011/0043220 A1 | 2/2011 | Leibowitz et al. | |
| 2012/0237036 A1* | 9/2012 | Dabak | H05K 5/0278 |
| | | | 380/287 |
| 2013/0303215 A1* | 11/2013 | Piipponen | H04W 24/02 |
| | | | 455/501 |
| 2014/0009315 A1 | 1/2014 | Kesling et al. | |
| 2014/0119486 A1* | 5/2014 | Mendel | H04L 25/08 |
| | | | 375/353 |
| 2014/0156902 A1 | 6/2014 | Kesling et al. | |
| 2014/0177752 A1 | 6/2014 | Kesling et al. | |
| 2015/0003500 A1 | 1/2015 | Kesling | |
| 2015/0003506 A1* | 1/2015 | Kesling | H04B 3/46 |
| | | | 375/224 |
| 2015/0178237 A1 | 6/2015 | Kesling et al. | |
| 2015/0180679 A1 | 6/2015 | Kesling | |

OTHER PUBLICATIONS

International Search Report received for corresponding International Application No. PCT/US2016/032962 dated Aug. 8, 2016, 14 pages of Search Report.

* cited by examiner

US 10,164,732 B2

ENCODING CIRCUIT, METHOD FOR TRANSMITTING DATA OVER A DATA BUS, AND RADIO COMMUNICATION DEVICE

TECHNICAL FIELD

Various embodiments relate generally to an encoding circuits, methods for transmitting data over a data bus, and radio communication devices.

BACKGROUND

Recent technological advances in modern Radio Access Technologies (RATs), such as Multiple Input Multiple Output (MIMO), the addition of new frequency bands, and multi-carrier schemes, have led to dramatic increases in data throughput capability. As a result, devices operating according to popular RATs such as WiFi (defined according to the IEEE 802.11 standard) and the telecommunications standards defined by the $3^{rd}$ Generation Partnership Project (3GPP, including Global System for Mobile Communications (GSM), Universal Mobile Telecommunication Systems (UMTS), and Long Term Evolution (LTE)) must have transceiver components capable of supporting high speed data buses.

However, the incorporation of high speed data buses in transceiver devices may yield increases in unwanted electrical noise, which may in turn reduce the sensitivity of radio frequency (RF) receivers. The issue of increased noise may be conventionally addressed with passive noise reduction techniques, such as by providing isolation in the coupling path between the high speed data buses and all victim blocks. The required levels of isolation may be relatively high (e.g. 60 dB or greater), which may be difficult to guarantee in many transceiver components.

In addition to passive isolation techniques, active noise mitigation approaches such as spectral line coding (SLC) may be able to shape the frequency spectrum of bus data in order to reduce the effects of data bus noise in targeted RF bands. SLC implementations may encode data by selecting a stream of encoded symbols that reduces the spectral energy of noise in the targeted RF bands.

However, conventional SLC approaches may only be able to reduce noise energy in a single RF band. Accordingly, existing SLC techniques may not be able to cancel out noise in multiple RF bands in parallel. This may be especially problematic in Global Navigation Satellite System (GNSS) receivers including Global Position System (GPS), GLObal NAvigation Satellite System (GLONASS), Galileo, and Beidou, which are sensitive in multiple RF bands.

Furthermore, existing SLC techniques only address noise components that are directly related to the data on the bus, but do not address potentially dominant noise components arising from the common-mode signal of differential data lines that are related more directly to transitions in the bus data rather than to the data itself and other spectral components that are derived by non-linear functions out of the data signal. Accordingly, the dominant common-mode signal in a differential data line may be unaffected by the aforementioned existing SLC techniques, and accordingly may continue to contribute noise to victim blocks in a substantially unrestricted manner. As used herein, "data-dependent" refers to signal and noise components that are addressed by existing SLC techniques, and "transition-dependent" refers to signal and noise components more directly related to data transitions rather than to the data itself.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
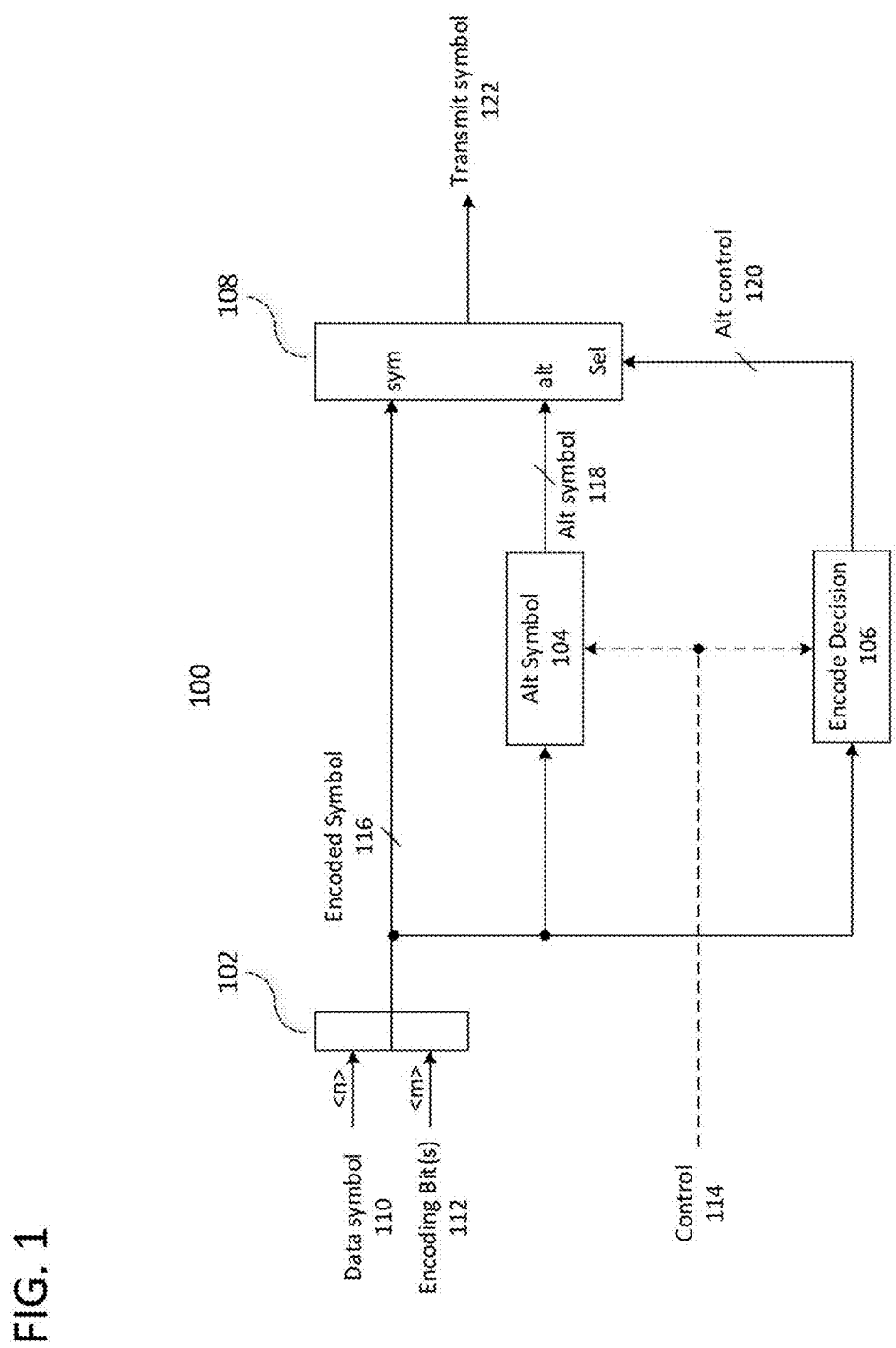
FIG. 1 shows an encoding circuit according to an aspect of the disclosure.

The following detailed description refers to the accompanying drawings that show, by way of illustration, specific details and embodiments in which the aspects of the disclosure may be practiced.

The word "exemplary" is used herein to mean "serving as an example, instance, or illustration". Any embodiment or design described herein as "exemplary" is not necessarily to be construed as preferred or advantageous over other embodiments or designs.

As used herein, a "circuit" may be understood as any kind of a logic implementing entity, which may be special purpose circuitry or a processor executing software stored in a memory, firmware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as for example Java. Any other kind of implementation of the respective functions which will be described in more detail below may also be understood as a "circuit". It may also be understood that any two (or more) of the described circuits may be combined into one circuit.

Spectral Line Coding (SLC) may be utilized to shape the frequency spectrum of a transmitted line code signal, such as a digital signal transmitted over a data bus. SLC may thus be useful in sensitive Radio Frequency (RF) receiver components in order to cancel or mitigate noise caused by data buses in a frequency band of interest.

Selective Inversion SLC may be implemented as a relatively effective SLC configuration for line coding in high speed data buses. In Selective Inversion SLC, an n-bit data symbol intended for transmission on the data bus is encoded with m encoding bit(s) in order to produce an m+n-bit encoded symbol. The logical inverse of the encoded symbol is then calculated to produce an m+n-bit inverted symbol, such as with a logical NOT operation. Then, a decision is made to transmit either the encoded symbol or the inverted symbol across the data bus based on whether transmission of the encoded symbol or the inverted symbol will result in less noise at a target frequency. This decision may be performed by calculating the phasor of the encoded symbol at the target frequency and determining whether transmission of either the encoded symbol or the inverted symbol will reduce the cumulative phasor of the target frequency, such as by integrating the phasor at the target frequency over time and evaluating which of the encoded symbol or the inverted symbol will minimize the integrated phasor.

Accordingly, either the encoded symbol or the inverted symbol may be selected as a transmit symbol (also m+n bits), which may then be transmitted across the data bus. By determining which of the encoded symbol or the inverted symbol will reduce the magnitude of the integrated phasor at a target frequency, the noise contributed at the target frequency by the data bus may be effectively reduced over time.

In RF transceiver implementations, the target frequency may be selected to be a frequency band at which RF reception is being performed. This may be particularly useful in Global Navigation Satellite System (GNSS) applications, which may involve high-sensitivity RF reception. Consequently, noise contribution by data bus components in such receivers may be reduced.

However, existing Selective Inversion SLC may only be effective in noise mitigation in a single frequency band, and thus may be incapable of mitigating noise in multiple RF bands in parallel. Furthermore, Selective Inversion SLC may only be useful for reducing data-dependent noise. When implemented with a differential data line configuration, Selective Inversion SLC may leave some common-mode signal contributions unaffected.

FIG. 1 illustrates an encoding circuit 100 according to an aspect of the disclosure. Encoding circuit 100 may include combiner 102, alternate symbol generator 104, encode decision block 106, and selector 108. The aforementioned components may be implemented as separate circuits or hardware elements, e.g. as separate integrated circuits blocks, as illustrated in FIG. 1. However, it is understood that some or all of the circuits may be implemented by a common programmable processor, such as e.g. a microprocessor. Accordingly, some or all of the functionality of the one or more of the aforementioned components may be consolidated into a single hardware component. It is also appreciated that encoding circuit 100 may include a number of additional components, including hardware, processors, memory, and other specialty or generic hardware/processors/circuits, etc.

Encoding circuit 100 may be e.g. provided as an encoding component for encoding data as a line-coded signal in order to transmit the data on a data bus, such as a high speed data bus. Encoding circuit 100 may be e.g. provided within a component tasked with RF reception, such as a GNSS device.

In contrast to conventional SLC encoders, encoding circuit 100 may be capable of reducing noise caused by operation of a data bus in multiple frequency bands in parallel. Additionally, encoding circuit 100 may also be able to perform transition-dependent noise mitigation in frequency bands.

Encoding circuit 100 may receive n-bit data symbol 110 and m encoding bit(s) 112 at combiner 102. Data symbol 110 may be a data symbol scheduled for transmission over a high speed data bus, e.g. as a line-coded signal. Encoding circuit 100 may therefore be configured to encode data symbol 110 as a line-coded signal and to transmit the resulting line-coded signal over the high speed data bus.

Combiner 102 may combine n-bit data symbol 110 and m encoding bit(s) 112 to produce m+n-bit encoded symbol 116. Combiner 102 may then provide m+n-bit encoded symbol 116 to selector 108.

Combiner 102 may also provide m+n-bit encoded symbol 116 to alternate symbol generator 104 and encode decision block 106. Alternate symbol generator 104 may be configured to generate alternate symbol 118 based on m+n-bit encoded symbol 116 and subsequently provide alternate symbol 118 to selector 108.

Encode decision block 106 may be configured to determine whether m+n-bit encoded symbol 116 or alternate symbol 118 should be transmitted. As will be later described, encode decision block 106 may be configured to calculate a phasor at one or more target frequencies, and to determine which of m+n-bit encoded symbol 116 or alternate symbol 118 will reduce the energy contribution to a cumulative phasor at the one or more target frequencies. Encode decision block 106 may then select either m+n-bit encoded symbol 116 or alternate symbol 118 to be transmitted based on which symbol will minimize (i.e. reduce) the cumulative phasor. Encode decision block 106 may then provide selector 108 with alt. control signal 120 indicating which of m+n-bit encoded symbol 116 or alternate symbol 118 should be transmitted.

Selector 108 may then select either m+n-bit encoded symbol 116 or alternate symbol 118 as transmit symbol 122, and may then transmit transmit symbol 122 over a high speed data bus. Although not explicitly depicted in FIG. 1, selector 108 may provide transmit symbol 122 to a line signal encoder in order to encode transmit symbol 122 as a line-encoded signal for transmission over the high speed data bus.

As shown in FIG. 1, encoding circuit 100 may also receive control signal 114 as an input. Control signal 114 may be provided to alternate symbol generator 104 and encode decision block 106. Control signal 114 may dictate an operation mode of encoding circuit 100. For example, encoding circuit 100 may be configured to perform spectral shaping for a data-dependent signal part or for a transition-dependent common-mode signal part. Control signal 114 may be provided to alternate symbol generator 104 and encode decision block 106 in order to control encoding circuit 100 to perform spectral shaping for a data-dependent signal part or for a transition-dependent common-mode signal part.

In addition to reduce spectral contribution at a single target frequency, encoding circuit 100 may be additionally configured to perform spectral shaping at a plurality of different target frequencies. For example, encoding circuit 100 may be implemented as a data bus component in an RF receiver, and may thus be configured to perform spectral shaping at one or more target frequencies that are being received by the RF receiver. Control signal 114 may be provided to encode decision block 106 in order to control the target frequencies at which spectral shaping is to take place.

Figure 2A:
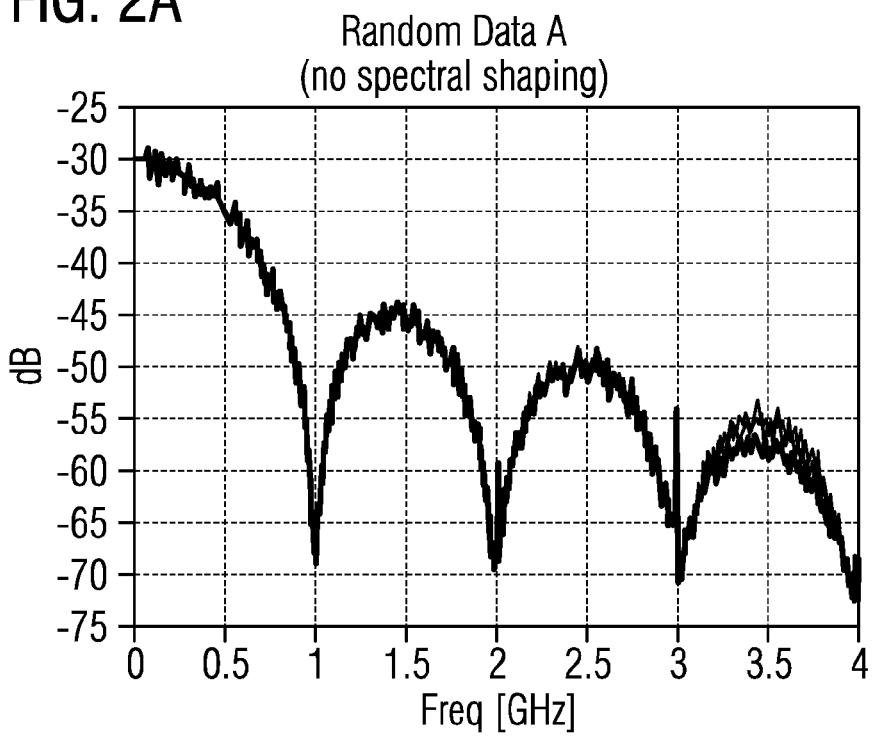
FIGS. 2A to 2B show exemplary test results of a spectral line coding application.
Figure 2B:
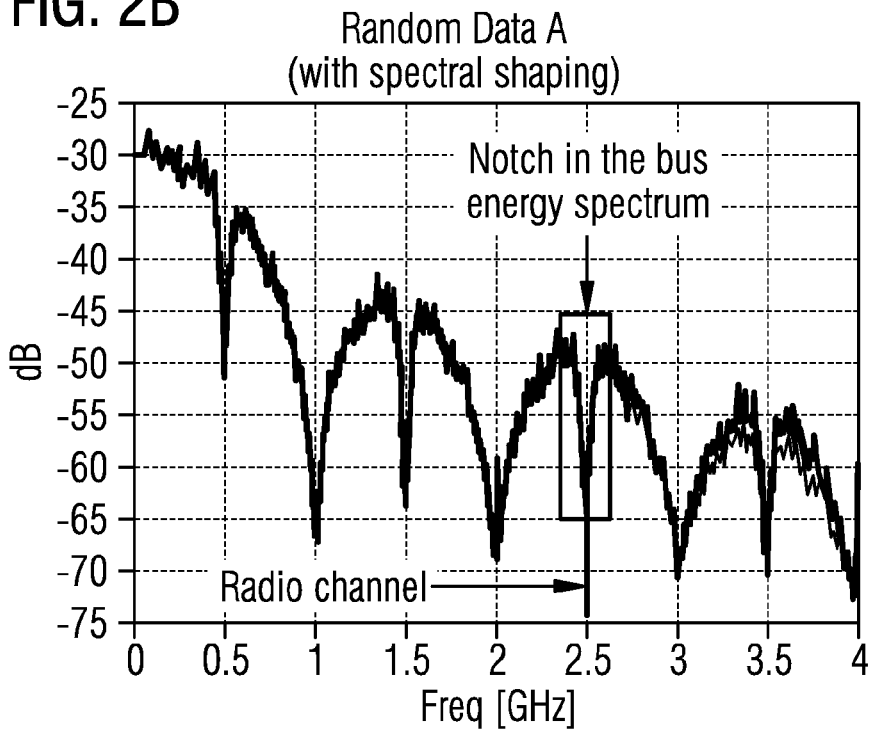

Encoding circuit 100 may thus be utilized in order to create a "notch" in the energy spectrum of bus data, such as bus data being outputted by a high speed data bus. FIGS. 2A-2B show exemplary results in which random data A is subject to spectral shaping, such as by encoding circuit 100. FIG. 2A illustrates the energy spectrum of random data A in the event that no spectral shaping is applied, while FIG. 2B illustrates the energy spectrum of random data A after spectral shaping is applied. As seen in FIG. 2B, the energy spectrum of random data A may be substantially reduced at notch frequency $f_{notch}$=2.5 GHz, which may be selected in order to coincide with an RF band of interest, such as the center frequency of a radio channel. The reduction of noise energy at a target frequency of interest may yield improved RF reception at the target frequency, thereby offering an overall improvement in performance.

Encoding circuit 100 may be able to create one or more notches in the noise energy spectrum according to several different operation modes, which may be controlled by control signal 114. In a first operation mode, encoding circuit 100 may be configured to create a notch at a target frequency in the spectrum of data-dependent signal parts. The first operation mode may be controlled by control signal 114, which may be provided to alternate symbol generator 104 and encode decision block 106 as shown in FIG. 1.

In order to create notches in the energy spectrum of an outputted line-coded signal, encoding circuit 100 may be configured to select either encoded symbol 116 or alternate symbol 118 as transmit symbol 122. Encoding circuit 100 may perform an evaluation on encoded symbol 116 using encoded decision block 106 in order to determine whether the transmission of the encoded symbol 116 or alternate symbol 118 will minimize the energy spectrum at notch frequency $f_{notch}$ over time. Encoding circuit 100 may then decide to transmit either encoded symbol 116 or alternate symbol 118 based on which of encoded symbol 116 or alternate symbol 118 will reduce the overall energy contribution at notch frequency $f_{notch}$ over time.

Encoded symbol 116 may therefore be provided to encode decision block 106. Encode decision block 106 may then render a decision as to whether encoded symbol 116 or alternate symbol 118 should be transmitted, and provide the resulting decision to selector 108 in the form of alt. control signal 120.

Encoding circuit 100 may render this decision based on the which of encoded symbol 116 or alternate symbol 118 will reduce the magnitude of the integrated phasor at notch frequency $f_{notch}$. Accordingly, encode decision block 106 may calculate the phasor at notch frequency $f_{notch}$ of encoded symbol 116 and the phasor at notch frequency $f_{notch}$ for alternate symbol 118. Encode decision block 106 may then add the phasor of encoded symbol 116 and the phasor of alternate symbol 118 to the integrated phasor of all past transmitted symbols. In other words, encode decision block 106 may maintain a cumulative phasor over time at $f_{notch}$ that details the spectrum energy contribution of all past transmit symbols 122 over time. Encode decision block 106 may then select either encoded symbol 116 or alternate symbol 118 as transmit symbol 122 based on which of encoded symbol 116 or alternate symbol 118 will minimize the magnitude of the integrated phasor at $f_{notch}$ over time, i.e. which of encoded symbol 116 or 118 will result in a minimal spectral contribution at notch frequency $f_{notch}$. For example, encoded decision block 106 may add the phasor of encoded symbol 116 the integrated phasor of all past transmitted symbols and the phasor of alternate symbol 118 to the integrated phasor of all past transmitted symbols in order to generate two adjusted integral phasors, each indicating the value of the integrated phasor if encoded symbol 116 or alternate symbol 118 is transmitted as transmit symbol 122. Encode decision block 106 may then compare the two adjusted integral phasors to each other in order to determine which of encoded symbol 116 or alternate symbol 118 will result in a lower adjusted integral phasor, such as by comparing the magnitude of the two integral phasors. Encode decision block 106 may then decide to transmit encoded symbol 116 or alternate symbol 118 based on which of encoded symbol 116 or alternate symbol 118 is associated with a lower-magnitude integral phasor, i.e. which of encoded symbol 116 or alternate symbol 118 will reduce the magnitude of the integrated phasor at notch frequency $f_{notch}$.

This approach may be effective for encoded and alternate symbol pairs as long as the phasors of the encoded and alternate symbol are not identical, i.e. do not have identical magnitude and direction. The approach may be optimized in certain cases if the phasor of the alternate symbol is pointing in an opposite direction to the phasor of the encoded symbol.

The phasor $P_k\{x\}$ at notch frequency $f_{notch}$ for the k-th block of w sequential bits in data stream $x=[x_1, x_2, \ldots]$ with bit rate R, where w=m+n (i.e. the length of encoded symbol 116), may be calculated as follows:

$$P_k\{x\} = \sum_{v=w\cdot(k-1)+1}^{w\cdot k} x_v \cdot e^{j2\pi f_{notch} \cdot v/R}. \quad (1)$$

Accordingly, Equation 1 may be used to calculate the phasor for encoded symbol 116. As previously detailed, the approach may be optimized through the use of alternate symbol 118 with a phasor pointing in the opposite direction of $P_k\{x\}$, i.e. $-P_k\{x\}$. This relationship may be realized by a simple bit inversion of encoded symbol 116, which in turn produces a phasor rotated 180 degree therefrom. In other words, $$P_k\{NOT(x)\}=-P_k\{x\} \quad (2).$$

Accordingly, alternate symbol 118 may be generated by performing a logical not operation on encoded symbol 116, i.e. alternate symbol 118=NOT (encoded symbol 116). As the phasor $P_k\{NOT(x)\}$ is the negative of phasor $P_k\{x\}$, encode decision block 106 may calculate the phasor for alternative symbol 118 directly from the calculated phasor for encoded symbol 116. Encode decision block 106 may simply compute the additive inverse of $P_k\{x\}$ (i.e. $-P_k\{x\}$) and utilize the resulting value as the phasor of alternate symbol 118. Encode decision block 106 may thus compute the adjusted integral phasors by adding phasor $P_k\{x\}$ to the integral phasor and subtracting phasor $P_k\{x\}$ from the integral phasor, respectively. Encode decision block 106 may then determine which adjusted integral phasor has a smaller magnitude, and select encoded symbol 116 or alternate symbol 118 accordingly.

Accordingly, in the first operation mode directed towards frequency notching for data-dependent signals parts, alternate symbol generator 104 may simply invert encoded symbol 116 to produce alternate symbol 118. Encode decision block 106 may calculate the phasor at notch frequency $f_{notch}$ of encoded symbol 116 and alternate symbol 118

(which is the negative of the phasor of encoded symbol 116), perform a comparison using an integrated phasor at $f_{notch}$ (i.e. by computing two adjusted integral phasors and comparing the respective magnitudes thereof), and select either encoded symbol 116 or alternate symbol 118 for transmission.

This first operation mode may be effective for creating a notch at notch frequency $f_{notch}$ for a data-dependent signal parts. However, differential data lines may additionally include a common-mode signal part dependent on data transitions rather than directly on the data itself, which may be substantially unaffected by the first operation mode. These transition-dependent components may not be linearly related with the data-dependent signal parts that are effectively addressed by the first operation mode. Accordingly, reception of RF signals at notch frequency $f_{notch}$ may still be degraded due to the presence spectral energy related to this unmitigated transition-dependent common-mode signal part.

Encoding circuit 100 may therefore be configured to perform in a second operation mode in order to address the transition-dependent common-mode signal part. Control signal 114 may be provided to alternate symbol generator 104 and encode decision block 106 in order to select between at least the first and second operation modes. As detailed above, the transition-dependent common-mode spectrum may be manifested in the transitions of a data stream, i.e. transitions between 0 and 1 in a sequence of bits. Accordingly, encode decision block 106 may be configured to assess the spectral energy of the transition-dependent common-mode spectrum at notch frequency $f_{notch}$ by first performing edge-detection of encoded symbol 116 and subsequently computing the phasor at notch frequency $f_{notch}$ using the edge-detected version of encoded symbol 116. In this manner, encode decision block 106 may render a decision to transmit encoded symbol 116 or alternate symbol 118 based on which of encoded symbol 116 or alternate symbol 118 will minimize the spectrum of the transitions at notch frequency $f_{notch}$. Encoding circuit 100 may therefore be able to create a notch at $f_{notch\_1}$ n the transition-dependent common-mode spectrum in the second operation mode.

Figure 3:
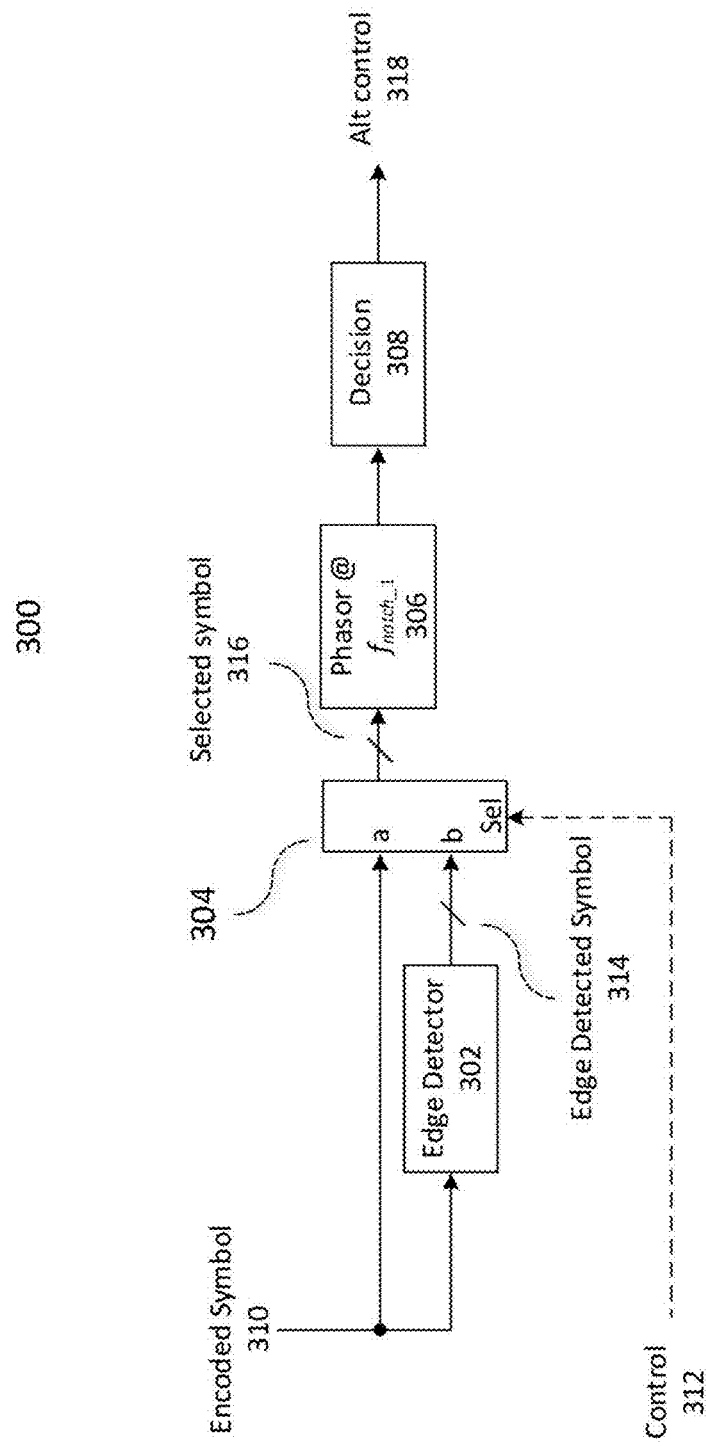
FIG. 3 shows a decision block branch according to an aspect of the disclosure.

FIG. 3 shows an exemplary decision block branch 300. Decision block branch 300 may be able to assess the data-dependent spectrum (i.e. consistent with the first operation mode) or the transition-dependent common-mode spectrum (i.e. consistent with the second operation mode). As will be later described, encode decision block 106 may be provided with one or more decision block branches, such as e.g. to create notches in the data-dependent spectrum and/or transition-dependent common-mode spectrum at a plurality of notch frequencies.

Decision block branch 300 may receive encoded symbol 310 and control signal 312 as inputs. Decision block branch 300 may then assess either the data-dependent spectrum (i.e. consistent with the first operation mode) or the transition-dependent common-mode spectrum (i.e. consistent with the second operation mode) of encoded symbol 310 based on control signal 312. Decision block branch 300 may then render a decision as to whether encoded symbol 310 or an alternate symbol associated with encoded symbol 310 should be transmitted, e.g. over a data bus. Decision block branch 300 may base the decision on which of encoded symbol 310 or the alternate symbol associated with encoded symbol 310 will minimize the magnitude of the intragrated phasor at notch frequency $f_{notch\_1}$ over time. Although decision block branch 300 is exemplary in nature, encoded symbol 310 and control signal 312 may be analogous to encoded symbol 116 and control signal 114 of FIG. 1.

Specifically, encoded symbol 310 may be provided to selector 304 and edge detector 302. Edge detector 302 may be configured to detect transitions (i.e. bit-level) in encoded symbol 310 and provide resulting edge detected symbol 314 to selector 304.

Selector 304 may then select either encoded symbol 310 or edge detected symbol 314 based on input provided by control signal 312. Selector 304 may then provide the resulting selection of either encoded symbol 310 or edge detected symbol 314 to phasor generator 306. Phasor generator 306 may then calculate the phasor at $f_{notch\_1}$ of encoded symbol 310 or edge detected symbol 314 (i.e. based on which of encoded symbol 310 or edge detected symbol 314 was provided as input).

Control signal 312 may control which portion of the spectrum is assessed by decision block branch 300 by controlling selector 304 to select either encoded symbol 310 or edge detected symbol 314. Control signal 312 may control decision block branch 300 to assess the data-dependent spectrum (i.e. consistent with the first operation mode) by selecting encoded symbol 310 (i.e. input a to selector 304). Alternatively, control signal 312 may control decision block branch 300 to assess the transition-dependent common-mode spectrum (i.e. consistent with the second operation mode) by selecting edge-detected symbol 314 (i.e. input b to selector 304).

Phasor generator 306 may then calculate a phasor at notch frequency $f_{notch\_1}$ based on the signal selected symbol 316 provided by selector 304. Phasor generator 306 may then provide the phasor to decision logic 308. Decision logic 308 may then determine whether the phasor provided by phasor generator 306 or the additive inverse of the phasor provided by phasor generator 306 will reduce the cumulative phasor at notch frequency $f_{notch\_1}$ over time. In other words, decision logic 308 may determine which of selected symbol 316 or the alternate symbol based on selected symbol 316 will minimize the cumulative phasor at notch frequency $f_{notch\_1}$ over time. Decision logic 308 may then indicate the resulting decision as to either selected symbol 316 or the alternate symbol based on selected symbol 316 as alternate control signal 318.

Decision logic 308 may render a decision based on an integrated phasor of all past decisions. In other words, decision logic 308 may calculate an integrated phasor at $f_{notch\_1}$ that reflects all past symbols transmitted over the data bus. Decision logic 308 may then utilize the phasor provided by phasor generator 306 in order to determine whether the phasor corresponding to encoded symbol 310 (i.e. the phasor provided by phasor generator 306) or the phasor corresponding to alternate symbol of encoded symbol 310 (i.e. the additive inverse of the phasor provided by phasor generator 306) will minimize the integrated phasor, and then select either selected symbol 316 (i.e. encoded symbol 310 or edge detected symbol 314 based on the control provided by control signal 312 to selector 304) or the alternate symbol based on selected symbol 316 to be transmitted over the data bus.

Decision block branch 300 may create a notch in the spectrum at notch frequency $f_{notch\_1}$ by selecting which of selected symbol 316 or the alternate symbol based on selected symbol 316 will contribute minimally to the integrated phasor at notch frequency $f_{notch\_1}$. Accordingly, providing encoded symbol 310 or edge detected symbol 314 to phasor generator 306 as selected symbol 316 may create a notch in the data-dependent spectrum or the transition-dependent common-mode spectrum, respectively. Control signal 312 may thus be used to select either the first or second operation mode based on which of data-dependent spectrum or the transition-dependent common-mode spectrum is targeted.

As detailed regarding FIG. 1, alternate symbol generator 104 may provide alternate symbol 118 to selector 108. Encode decision block 106 may then select either encoded symbol 116 or alternate symbol 118 to be transmitted as transmit symbol 122 based on which of encoded symbol 116 or alternate symbol 118 will minimize the spectral contribution at a notch frequency $f_{notch}$. In the first operation mode, alternate symbol generator 104 may perform a logical NOT operation on encoded symbol 116 to produce alternate symbol 118. As an alternate symbol 118 that is the logical NOT of encoded symbol 116 will produce a phasor in the opposite direction, this approach is appropriate for the first operation mode in which the data-dependent spectrum is assessed and minimized at notch frequency $f_{notch}$. Accordingly, alternate symbol generator 104 may provide alternate symbol 118 as the logical inverse of encoded symbol 116 in the first operation mode. Similarly, encode decision block 106 may be configured to assess whether encoded symbol 116 or the logical inverse of encoded symbol 116 (i.e. alternate symbol 118) will minimize the phasor at notch frequency $f_{notch}$. This control may be indicated to alternate symbol generator 104 and encode decision block 106 by control signal 114.

However, as previously detailed the transition-dependent common-mode spectrum may be assessed by evaluating the transitions in encoded symbol 116, i.e. by performing edge detection on encoded symbol 116 and assessing the spectral contribution at notch frequency $f_{notch}$ of the resulting edge-detected symbol. However, both encoded symbol 116 and the logical inverse of encoded symbol 116 (i.e. alternate symbol 118 in the first operation mode) will have identical transition timing. Accordingly, selecting either encoded symbol 116 or the logical inverse of encoded symbol 116 as transmit symbol 122 may not affect the transition-dependent common-mode spectrum. A different alternate symbol 118 from the logical inverse of encoded symbol 116 may therefore be used in the second operation mode in order to effectively address the transition-dependent common-mode spectrum.

An effective alternate symbol 118 for affecting the common-mode spectrum may be the logical odd-bit inverted version of encoded symbol 116. In other words, only every-other bit of encoded symbol 116 is inverted, as opposed to every bit of encoded symbol 116. Accordingly, the phasor for alternate symbol 118 after edge-detection may be the additive inverse of the phasor for encoded symbol 116 after edge-detection. In other words, the phasor of the transitions for encoded symbol 116 may be opposite to the phasor of the transitions for alternate symbol 118 if alternate symbol 118 is generated as the logical odd-bit inversion of encoded symbol 116. Accordingly, encode decision block 106 may be able to select either encoded symbol 116 or alternate symbol 118 based on which of encoded symbol 116 or alternate symbol 118 will minimize the spectral contribution of the transitions at notch frequency $f_{notch1}$.

Accordingly, alternate symbol generator 104 may be configured to provide alternate symbol 118 as the logical inverse of encoded symbol 116 in the first operation mode. Alternate symbol generator 104 may then be configured to provide alternate symbol 118 as the odd-bit logical inverse of encoded symbol 116 in the second operation mode. Likewise, encode decision block 106 may be configured to render a decision to transmit either encoded symbol 116 or alternate symbol 118 based on alternate symbol 118 being either the logical inverse of encoded symbol 116 or the odd-bit logical inverse of encoded symbol 116. Encode decision block 106 may thus be configured to calculate the appropriate phasor for alternate symbol 118 based on this relationship to encoded symbol 116, and render a decision accordingly. As the phasor of the edge-detected version of alternate symbol 118 will be the additive inverse of the edge-detected version of encoded symbol 116, encode decision block 106 may operate in substantially the same manner in the second operation mode as in the first operation mode, i.e. by adding the phasor corresponding to the edge-detected symbol to the integrated phasor to generate a first adjusted phasor and subtracting the phasor corresponding to the edge-detected symbol (i.e. the phasor of the edge-detected version of the alternate symbol in order to generate a second adjusted phasor. Encode decision block 106 may then select either encoded symbol 116 or alternate symbol 118 based on whether the first adjusted phasor has greater magnitude than the second adjusted phasor. Accordingly, decision block branch 300 may be utilized in either the first operation mode or the second operation mode.

It is additionally appreciated that a plurality of alternate symbols may be provided. For example, the configurations disclosed herein may be expanded to include more than one alternate symbol generator, e.g. three alternate symbol generators, where each alternate symbol generator may be configured to generate a unique alternate symbol with respect to encoded symbol 116. Each alternate symbol generator may be configured to invert one or more bits of encoded symbol 116 in order to generate the respective alternate symbol. Encode decision block 106 may then evaluate the phasor at $f_{notch}$ for encoded symbol 116 and the phasors at $f_{notch}$ for each of the alternate symbols. As each of the alternate symbols is unique (and all non-identical to the phasors of each other and the phasor of encoded symbol 116), each symbol may produce a different phasor at $f_{notch}$. As a result, encode decision block 106 may be able to select any of the available symbols as transmit symbol 122, thereby potentially increasing the effectiveness of frequency notching due to the expanded selection. It is understood that such methods may increase data throughput requirements, as an appropriate number of encoding bits (i.e. at least two for three alternate symbols) are additionally required in order to ensure recovery of data symbol 110 at an opposite end of the data bus. Furthermore, it is appreciated that the relationship between the phasor of encoded symbol 116 and the phasors of the additional alternate symbols may be more complex than an additive inverse, and accordingly modifications in the phasor evaluation process of encode decision block 106 may need to be modified in order to correctly calculate and evaluate the phasors at $f_{notch}$ for each of the additional alternate signals.

Figure 4:
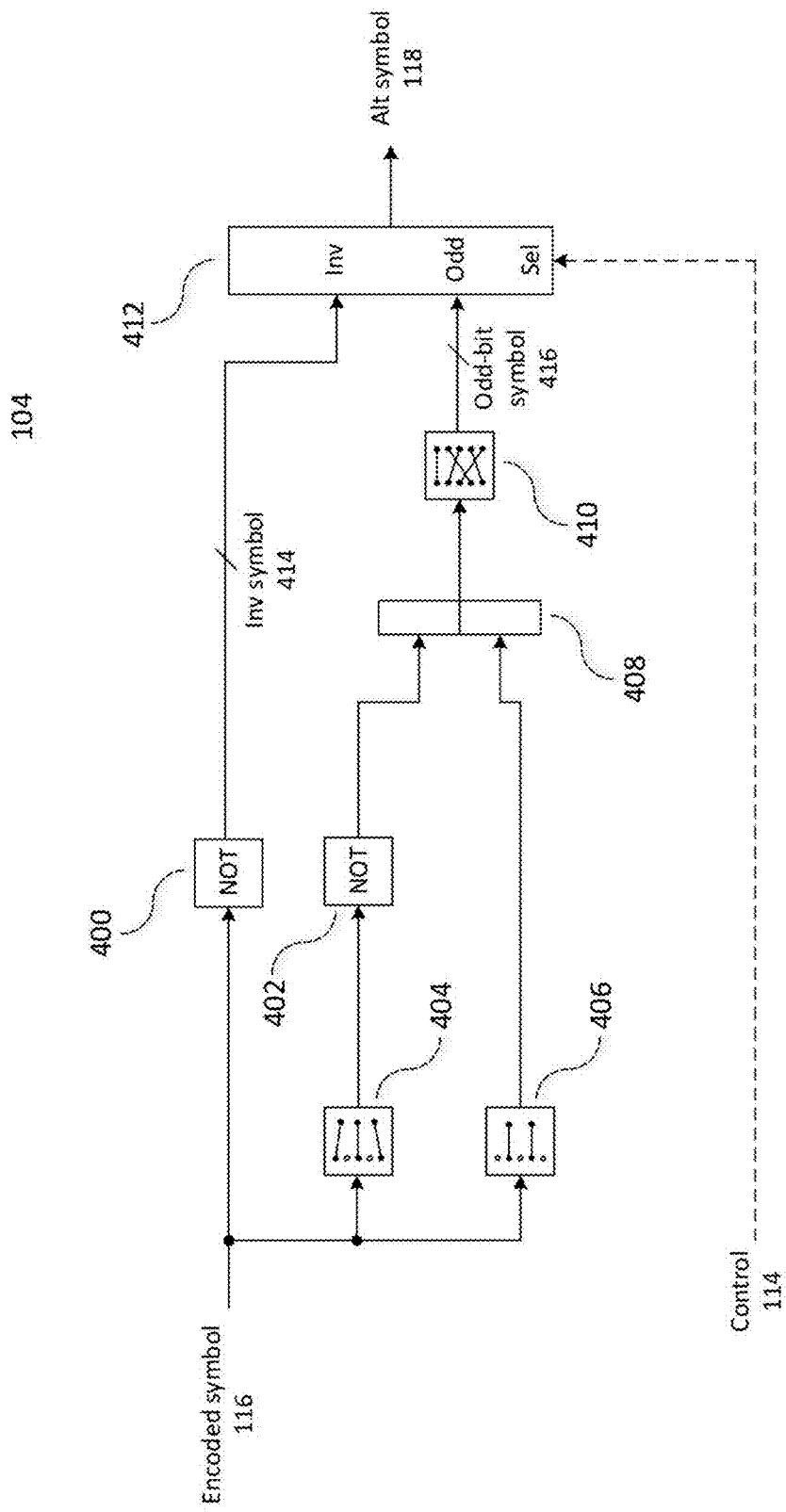
FIG. 4 shows an alternate symbol generation circuit according to an aspect of the disclosure.

FIG. 4 shows an exemplary internal configuration of alternate symbol generator 104. As shown in FIG. 4, alternate symbol generator 104 may receive encoded symbol 116 and control signal 114 as input. Alternate symbol generator 104 may then output alternate symbol 118, such as to selector 108 as shown in FIG. 1.

Alternate symbol generator 104 as shown in FIG. 4 may be configured to provide the logical inverse of encoded symbol 116 or the odd-bit logical inverse of encoded symbol 116 as alternate symbol 118. The selection of the logical inverse of encoded symbol 116 or the odd-bit logical inverse of encoded symbol 116 as alternate symbol 118 may be controlled by control signal 114, which may be provided to selector 412 in order to perform the appropriate selection. In the first operation mode, control signal 114 may indicate that inverted symbol 414 should be selected as alternate symbol 118. Alternatively, in the second operation mode control signal 114 may indicated that odd-bit inverted symbol 416 should be selected as alternate symbol 118. Accordingly, alternate symbol generator 104 may be able to provide alternate symbol 118 as appropriate to create a notch in either a data-dependent spectrum or transition-dependent common-mode spectrum consistent with the first operation mode and second operation mode, respectively.

Encoded symbol 116 may be provided to logical inverter 400, which may perform a logical NOT operation on encoded symbol 116 to produce inverted symbol 414. Inverted symbol 414 may then be provided to selector 412.

Encoded symbol 116 may also be provided to odd-bit selector 404 and even-bit selector 406. Odd-bit selector 404 may select the odd-numbered bits of encoded symbol 116 and provide the resulting bits to logical inverter 402. Logical inverter 402 may then perform a logical NOT operation on the odd-numbered bits and provide the inverted odd-numbered bits to combiner 408.

Even-bit selector 406 may select the even-numbered bits of encoded symbol 116. Even-bit selected 406 may then provide the resulting even-numbered bits of encoded symbol 116 to combiner 408.

Combiner 408 may then combine the even-numbered bits and inverted odd-numbered bits of encoded symbol 116 and provide the resulting symbol to bit selector 410. Bit selector 410 may then re-organize the inverted odd-numbered bits and even-numbered bits of encoded symbol 116 into the original respective bit positions of each bit, and provide resulting odd-bit inverted symbol 416 to selector 412.

Selector 412 may therefore receive inverted symbol 414 and odd-bit inverted symbol 416 as inputs. Selector 412 may then select either inverted symbol 414 and odd-bit inverted symbol 416 as alternate symbol 118 based on control signal 114. Alternate symbol generator 104 may therefore supply alternate symbol 118 as the logical inversion of encoded symbol 116 in the first operation mode in order to address the data-dependent spectrum. Alternative symbol generator 104 may alternatively supply alternate symbol 118 as the odd-bit inversion of encoded symbol 116 in the second operation mode in order to address the transition-dependent common-mode spectrum.

Referring back to FIG. 1, alternate symbol generator 104 may therefore supply the appropriate alternate symbol 118 based on whether the first operation mode or second operation mode is selected. Encode decision block 108 may then assess the spectral impact of encoded symbol 116 or alternate symbol 118 (which may be either the logical inverse of encoded symbol 116 or the odd-bit inverse of encoded symbol 116) on either the data-dependent spectrum or transition-dependent common-mode spectrum at a notch frequency $f_{notch}$, and provide appropriate control to selector 108 in order to select either encoded symbol 116 or alternate symbol 118 as transmit symbol 122. Encoding circuit 100 may therefore create a notch at notch frequency $f_{notch\_1}$ n the data-dependent spectrum or transition-dependent common-mode spectrum through proper selection of encoded symbol 116 or alternate symbol 118 as transmit symbol 122.

In a third mode of operation, encoding circuit 100 may additionally be capable of creating notches in outputted bus data (i.e. a data stream of transmit symbols 122) at multiple notch frequencies for the data-dependent spectrum or transition-dependent common-mode spectrum. This may be particularly advantageous in applications of encoding circuit 100 in RF receivers that perform reception in a plurality of RF bands, such as GNSS receivers.

A serial implementation of multiple encoding circuits each targeting a separate notch frequency is not effective in producing notches at multiple frequencies. However, the contribution of spectral energy at each of the notch frequencies may be considered in a cumulative manner in the decision to select encoded symbol 116 or alternate symbol 118 as transmit symbol 122. Accordingly, encode decision block 106 of encoding circuit 100 may include multiple decision block branches similar to decision block branch 300 provided in parallel, where each of the multiple decision block branches targets an individual notch frequency. Each of the multiple decision block branches may evaluate the spectral contribution of either the data-dependent spectrum or transition-dependent common-mode spectrum at the respective notch frequency. The spectral contribution at each notch frequency as determined by each of the decision block branches may then be considered in a cumulative manner in order to determine whether to transmit encoded symbol 116 or alternate symbol 118 as transmit symbol 122. Accordingly, the impact of the noise spectral energy contributed at each notch frequency by transmit symbol 122 may be considered in order to select encoded symbol 116 or alternate symbol 118 as transmit symbol 122 such that the noise spectrum is reduced at each notch frequency.

Figure 5:
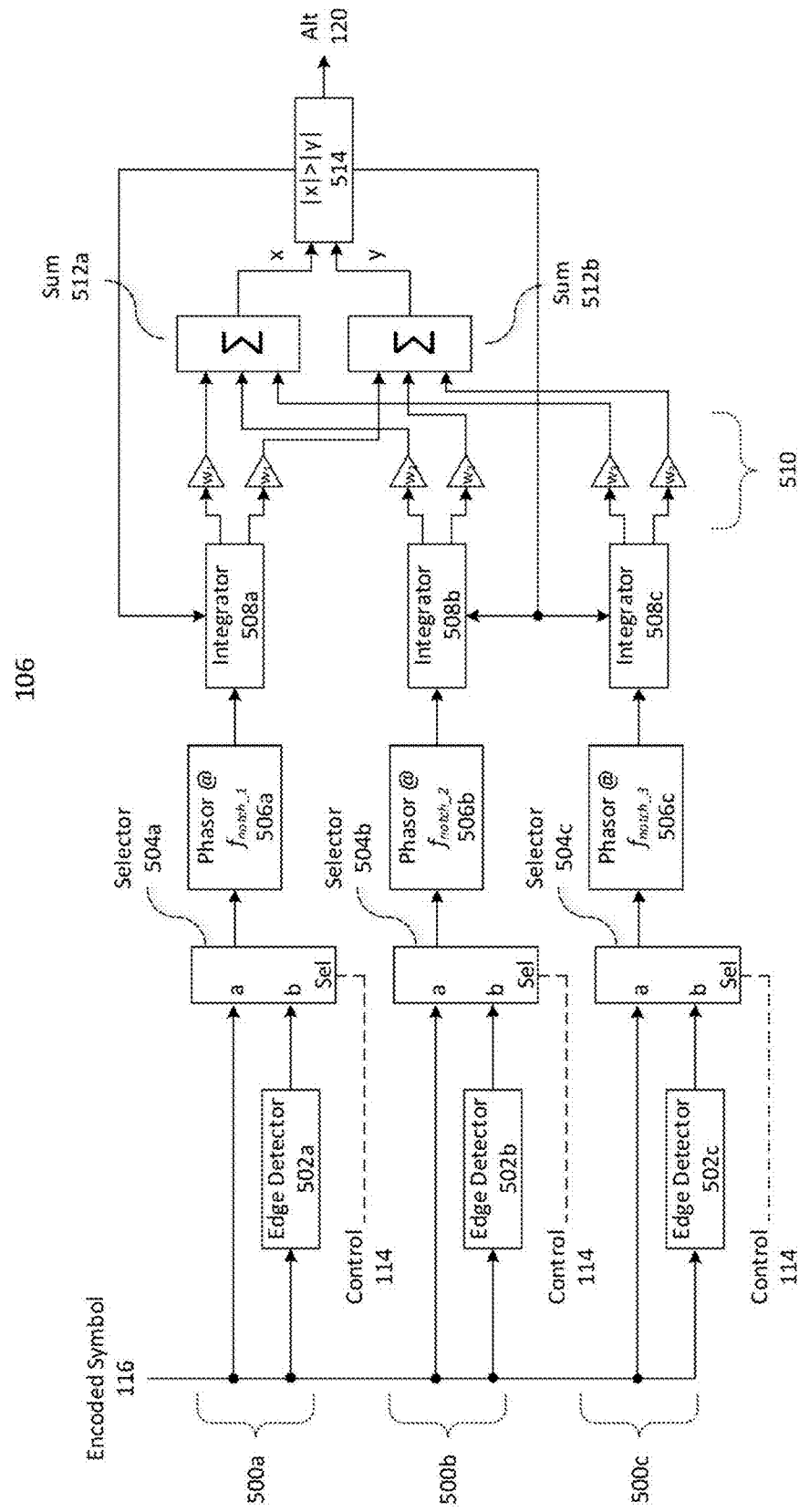
FIG. 5 shows an encode decision block according to an aspect of the disclosure.

FIG. 5 shows an exemplary internal configuration of encoding decision block 106 of encoding circuit 100. Encoding decision block 106 may contain multiple decision block branches 500a-500c. Each of decision block branches may contain similar components as exemplary decision block branch 300 shown in FIG. 3. However, encoding decision block 106 may utilize decision block branches 500a-500c in parallel to select encoded symbol 116 or alternate symbol 118 based on the potential spectral contribution of both select encoded symbol 116 or alternate symbol 118 a plurality of notch frequencies.

It is appreciated that encoding decision block 106 may contain any number of decision block branches. The number of decision block branches may be dependent on a desired number of notch frequencies. For example, a configuration of encoding decision block 106 as shown in FIG. 5 containing three decision block branches may be suitable for producing a notch in three distinct notch frequencies $f_{notch\_1}$, $f_{notch\_2}$, and $f_{notch\_3}$. Decision block branches 500a-500c may be added to or removed dependent on the number of desired notch frequencies. It is also appreciated that a single decision block branch such as decision block branch 300 may be utilized for creating a notch at a single frequency. Weighting logic 510 and summing logic 512 may accordingly not be required in such a configuration, as decision block branch 300 may only be required to render a decision for a single notch frequency as opposed to rendering an aggregate decision based on a plurality of notch frequencies.

Accordingly, encoding circuit 100, such as of FIG. 1, may operate in the third operation mode in order to produce notches in the bus data energy spectrum at multiple notch frequencies. Encoding circuit 100 operating according to the third operation mode may also be able to create multiple notches in the data-dependent spectrum or transition-dependent common-mode spectrum, which may be controlled by control signal 114.

Encoding decision block 106 may receive encoded symbol 116 as input. Encoded symbol 116 may then be provided to edge detectors 502a-502c and selectors 504a-504c. Edge detectors 502a-502c may then perform edge detection on encoded symbol 116 in order to identify bit-level transitions therein, and may provide the resulting edge-detected symbol to selectors 504a-504c.

Selectors 504a-504c may be controlled by control signal 114, which may direct selectors 504a-504c to select either the edge-detected symbols provided by edge detectors 502a-502c or encoded symbol 116. Selectors 504a-504c may then provide the selected symbols to phasor generators 506a-506c.

Phasor generators 506a-506c may then be configured to calculate the phasor of the received input symbol at notch frequencies $f_{notch\_1}$, $f_{notch\_2}$, and $f_{notch\_3}$, respectively. Selection of the edge-detected symbols provided by edge detectors 502a-502c by selectors 504a-504c may therefore result in phasor generators 506a-506c targeting the transitions in encoded symbol 116, and accordingly phasor generators 506a-506c will therefore evaluate the transition-dependent common-mode spectrum of encoded symbol 116. Alternatively, selection of encoded symbol 116 by selectors 504a-504c will result in phasor generators 506a-506c evaluating the data-dependent spectrum of encoded symbol 116.

Phasor generators 506a-506c may then calculate the phasor for the provided input symbol (either encoded symbol 116 or edge-detected encoded symbol 116) at respective notch frequencies $f_{notch\_1}$, $f_{notch\_2}$, and $f_{notch\_3}$. Phasor generators 506a-506c may then provide the calculated phasors to integrators 508a-508c.

Integrators 508a-508c may be configured to calculate an integrated phasor over time at the respective notch frequency based on previously transmitted transmit symbols 122. The integrated phasor calculated at each of integrators 508a-508c may therefore be the phasor of the transmitted data stream over time.

Integrators 508a-508c may then be configured to output two adjusted integral phasors based on the received phasors from phasor generators 506a-506c and the integrated phasor. The two adjusted integral phasors may be the sum of the integrated phasor and the phasor provided by the respective phasor generators 506a-506c and the sum of the integrated phasor and the additive inverse of the phasor provided by the respective phasor generators 506a-506c. As previously detailed, the additive inverse of the phasor provided by the respective phasor generators 506a-506c. Accordingly, integrators 508a-508c may calculate the first adjusted integral phasor as the sum of the integrated phasor and the phasor provided by the respective phasor generators 506a-506c and the difference of the integrated phasor and the of the phasor provided by the respective phasor generators 506a-506c.

As shown in FIG. 5, integrators 508a-508c may receive a feedback signal from comparator 514 in order to incorporate the most recent decision (i.e. to transmit encoded symbol 116 or alternate symbol 118) into the integrated phasors at notch frequencies $f_{notch\_1}$, $f_{notch\_2}$, and $f_{notch\_3}$. Integrators 508a-508c may then provide the resulting adjusted integrated phasors to weighting logic 510. It is appreciated that the integrated phasor of past decisions can be shared between blocks 508a-508c.

Weighting logic 510 may provide weighting to the adjusted integrated phasors in order to weight notch frequencies $f_{notch\_1}$, $f_{notch\_2}$, and $f_{notch\_3}$ with respect to one another. For example, weighting coefficients $w_1$, $w_2$, and $w_3$ may be programmable in order to more heavily weight one of notch frequencies $f_{notch\_1}$, $f_{notch\_2}$, and $f_{notch\_3}$. Encoding circuit 100 may therefore be configured to place higher importance on producing an effective notch at one of notch frequencies $f_{notch\_1}$, $f_{notch\_2}$, and $f_{notch\_3}$.

The weighted output signals from weighting logic 510 may then be provided to summing logic 512. Summing logic component 512a may receive the weighted sums corresponding to the phasors of encoded symbol 116/edge-detected encoded symbol 116. Summing logic component 512b may receive the weighted sums corresponding to the phasors of alternate symbol 118. Summing logic 512 may then compute respective sum values x and y.

Comparator 514 may then compare the respective sum values x and y in order to determine whether encoded symbol 116 or alternate symbol 118 will produce the minimal spectral contribution distributed across all of notch frequencies $f_{notch\_1}$, $f_{notch\_2}$, and $f_{notch\_3}$. Accordingly, comparator 514 may render an aggregate decision across all notch frequencies $f_{notch\_1}$, $f_{notch\_2}$, and $f_{notch\_3}$ based on the sum values provided by summing logic 512.

Comparator 514 may then produce alternate control signal 120, which may then be provided to selector 108 as shown in FIG. 1. Comparator 514 may be configured to generate alternate control signal 120 according to a Boolean evaluation of the expression |x|>|y|. In other words, comparator 514 may generate alternate control signal 120 to select input 0 (i.e. sym input of selector 108) if the expression |x|>|y| is false, thereby selecting encoded symbol 116 as transmit symbol 122. Conversely, comparator 514 may generate alternate control signal 120 to select input 1 (i.e. alt input of selector 108) if the expression |x|>|y| is true, thereby selecting alternate symbol 118 as transmit symbol 122. Comparator 514 may thus be configured to provide alternate control signal 120 based on which of encoded symbol 116 or alternate symbol 118 results in the integral phasor with the smallest cumulative magnitude across all of notch frequencies $f_{notch\_1}$, $f_{notch\_2}$, and $f_{notch\_3}$.

Alternate control signal 120 may thus dictate which of encoded symbol 116 or alternate symbol 118 will be transmitted across the data bus at transmit symbol 122. As encoding decision block 108 may be configured to determine alternate control signal 120 based on the spectral contribution at a plurality of notch frequencies $f_{notch\_1}$, $f_{notch\_2}$, and $f_{notch\_3}$, each of notch frequencies $f_{notch\_1}$, $f_{notch\_2}$, and $f_{notch\_3}$ may see a reduction in noise spectral energy over time. Encoding circuit 100 may thus create a notch multiple notch frequencies.

The resulting notches at each of notch frequencies $f_{notch\_1}$, $f_{notch\_2}$, and $f_{notch\_3}$ may be created in the data-dependent spectrum or the transition-dependent common-mode spectrum based on control signal 114. It is appreciated that the resulting notches may be most effective in the event that control signal 114 provides identical control to each of selectors 504a-504c, e.g. directs all of selectors 504a-504c to select the same input a or b. Consequently, comparator 514 may then render the decision to transmit either encoded symbol 116 or alternate symbol 118 only based on either the data-dependent phasor or transition-dependent common-mode phasor. However, as will be later described it is appreciated that control signal 114 may provide each of selectors 504a-504c an independent control signal, phasor generators 506a-506c may accordingly generate phasors based on encoded symbol 116 or on the edge-detected version of encoded symbol 116 provided by edge detectors 502a-502c. In this manner, notches may be created in both the data-dependent spectrum and transition-dependent common-mode spectrum at the same or different frequencies.

It is appreciated that the above-detailed examples may be applied to a stream of data, such as e.g. a stream of data to be transmitted across a high-speed data bus. The stream of data may be grouped into a plurality of data symbols 110, and each of the plurality of data symbols 110 may then be combined with encoding bits 112 to produce a plurality of encoded symbols 116. Encoding circuit 100 may then be configured to transmit each of the plurality of encoded symbols 116 as a stream of transmit symbols 122 in accordance with the aforementioned approaches. Encoding circuit may thus transmit the stream of data in such a manner that one or more notches are created at one or more notch frequencies.

Figure 6:
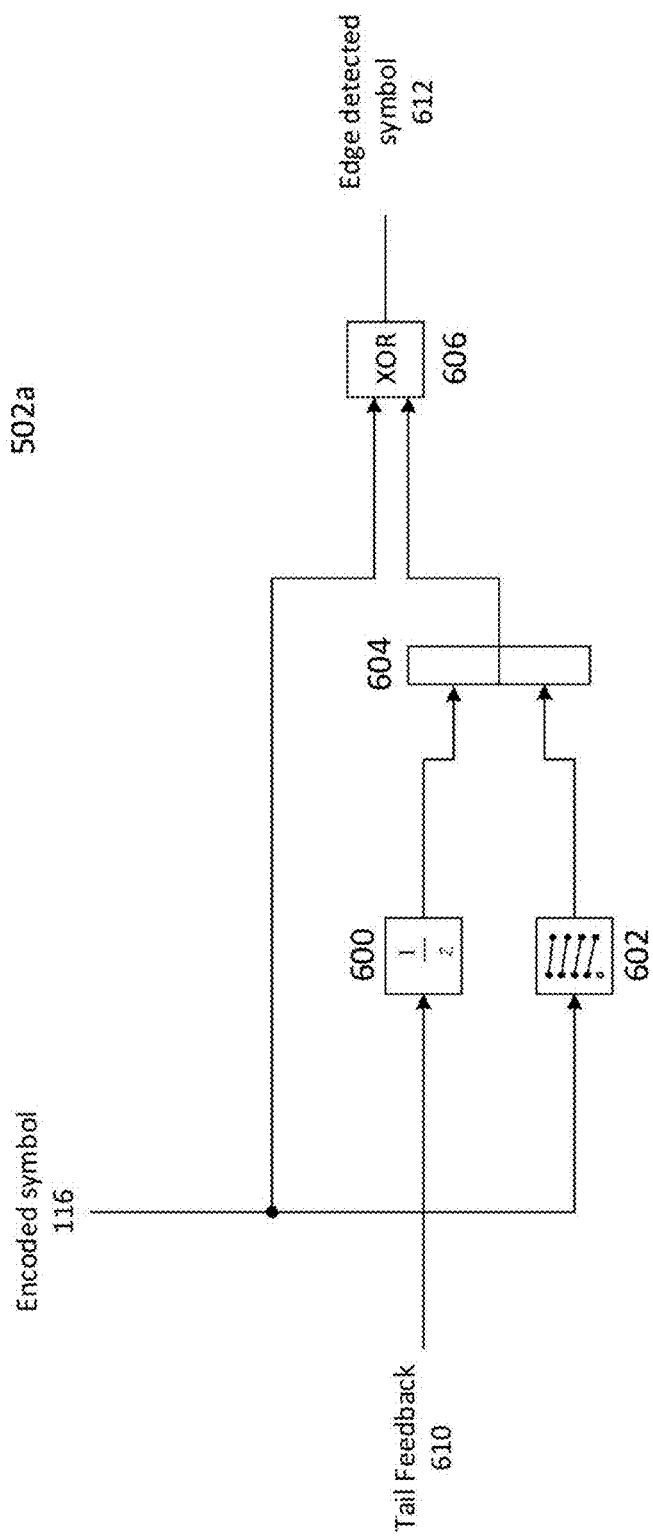
FIG. 6 shows an edge-detection circuit according to an aspect of the disclosure.

FIG. 6 shows an exemplary implementation of edge detector 502a. It is appreciated that edge detectors 502b-502c, in addition to any further included edge detectors based on the overall number of notch frequencies, may be configured in a similar manner.

As shown in FIG. 6, edge detector 502a may be implemented using a straightforward logical XOR setup. Edge detector 502a may receive encoded symbol 116 as input and provide encoded symbol 116 to XOR logic 606 and to selector 602. Edge detector 502a may also receive tail feedback signal 610, which contains the trailing bit or bits of the most recently transmitted transmit symbol 122. Tail feedback signal 610 may be provided to delay logic 600, which may execute a single unit delay thereon. The delayed output of delay logic 600 may then be provided to combiner 604.

Selector 602 may select the leading bits of encoded symbol 116 and provide the leading bits to combiner 604. Combiner 604 may then append the received leading bits of encoded symbol 116 to the delayed tail feedback signal 610, and provide the resulting symbol to XOR logic 606. XOR logic 606 may then perform a logical XOR between the encoded symbol 116 and the symbol provided by combiner 604, which may be encoded symbol 116 delayed by one bit appended to the most recently transmitted bit. The output of XOR logic 606 may thus be an edge-detected version of encoded symbol 116, where each bit-wise high/low transition is indicated as a 1 while the remaining bit-wise non-transitions are indicated as zero. Edge detector 502a may thus produce edge-detected symbol 612 representing the transitions in encoded symbol 116. As shown in FIG. 5 regarding encoding decision block 106, the edge-detected symbol 612 may be provided to selector 504a and phasor generator 506a, thereby allowing phasor generator 506a to assess the transition-dependent common-mode spectrum contained in the transitions of encoded symbol 116.

Encoding circuit 100 may be implemented in the transmitter side of a data bus, and thus may be used to select a sequence of transmit symbols 122 to be transmitted over the data bus. The sequence of transmit symbols 122 may then be received on a destination side of the data bus by a receiver. The receiver may then recover the original sequence of data symbols 110 from the received sequence of transmit symbols 112 by examining the encoding bit(s) 112. This operation may be performed by e.g. a decoding circuit of a data bus receiver.

Figure 7:
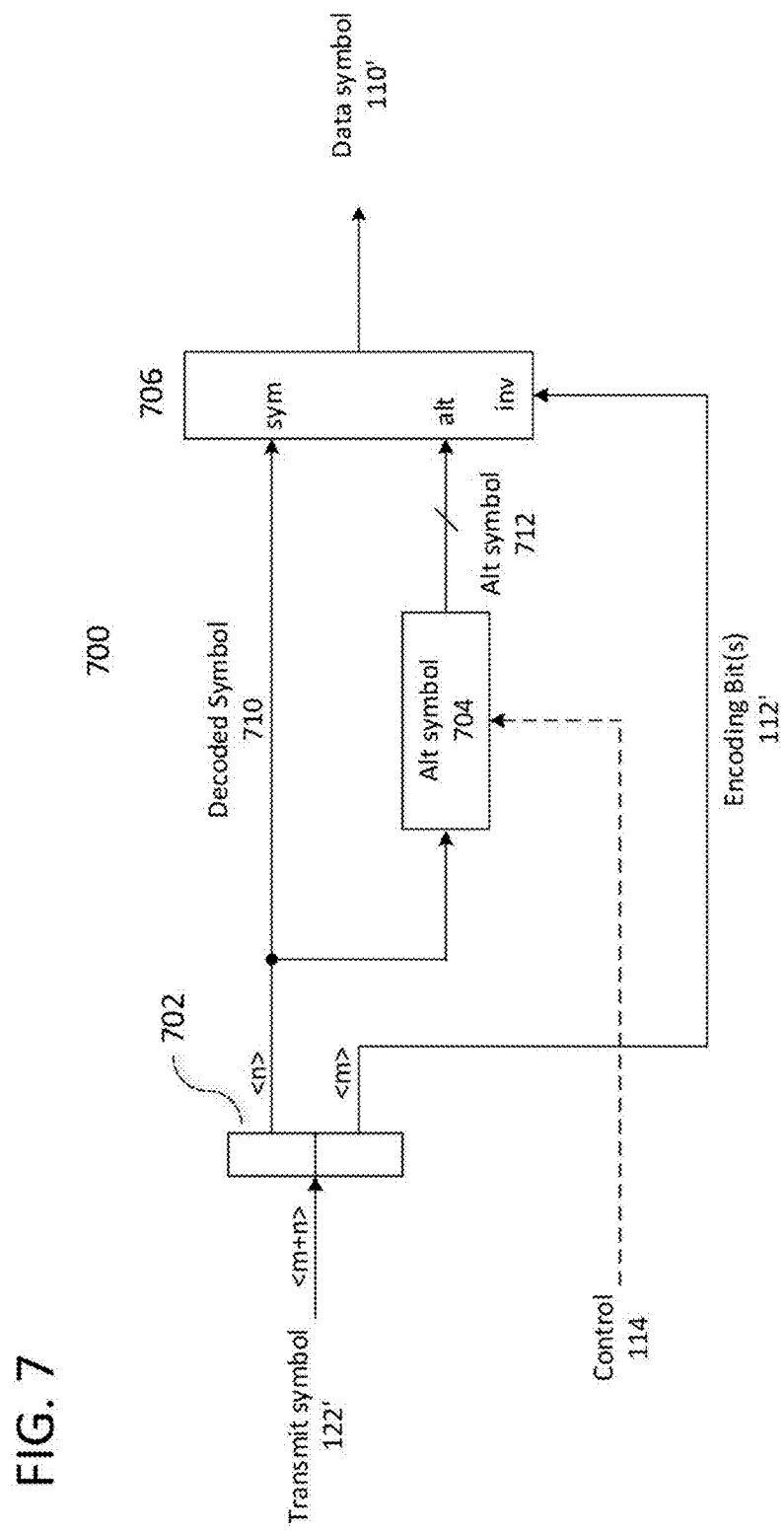
FIG. 7 shows a decoding circuit according to an aspect of the disclosure.

FIG. 7 illustrates an exemplary internal configuration of decoding circuit 700. Decoding circuit 700 may be configured to receive a sequence of transmit symbols 122' over a data bus from a transmitter utilizing encoding circuit 100 for encoding. Decoding circuit 700 may then perform decoding on the received sequence of transmit symbols 122' in order to recover the original sequence of data symbols 110'.

Decoding circuit 700 may receive transmit symbol 122', which may have been previously transmitted over a data bus after being encoded by e.g. encoding circuit 100. It is appreciated that due to potential transmission error received transmit symbol 122' may not be identical to transmit symbol 122. It is similarly appreciated that processing such as error-correction may be performed in order to correct such errors.

Decoding circuit 700 may provide transmit symbol 122 to separator 702. Separator 702 may then split m+n-bit transmit symbol 122 into n-bit decoded symbol 710 and m encoding bit(s) 112. As encoding circuit 100 is configured to either transmit encoded symbol 116 or alternate symbol 118 as transmit symbol 122, it is understood that decoded symbol 710 may be either data symbol 110 or an alternate version of data symbol 110 according to alternate symbol 118.

Decoded symbol 710 may therefore correspond to data symbol 110, data symbol 110 after inversion (i.e. when encoding circuit 100 is operating in the first operation mode or third operation mode with data-dependent spectrum notching), or data symbol 110 after odd-bit inversion (i.e. when encoding circuit 100 is operating in the second operation mode or third operation mode with transition-dependent common-mode spectrum notching).

Decoded symbol 710 may be provide to selector 706 and to alternate symbol generator 704. Alternate symbol generator 704 may be configured to generate an alternate symbol of decoded symbol 710 based on the operation mode of encoding circuit 100. Accordingly, control signal 114 may be additionally provided to receiver 700 in order to recover data symbol 110 from received transmit symbol 122. Encoding circuit 100 and decoding circuit 700 may thus be synchronized in order to properly recover data symbol 120 at the receiver side.

Alternate symbol generator 704 may therefore be implemented in a similar fashion as to alternate symbol generator 104. It is appreciated that differences may exist due to the removal of encoding bits 112'. Nevertheless, alternate symbol generator 104 may be configured to generate alternate symbol 712 that is either the logical inverse of decoded symbol 710 or the odd-numbered bit logical inverse of decoded symbol 710. This may be determined by control signal 114, which may indicated the proper alternate symbol generation protocol in order to remain coordinated with the alternate symbol generation of encoding circuit 100.

Decoded symbol 710 and alternate symbol 712 may then be provided to selector 706. Encoding bit(s) 112' may also be provided to selector 706, and may be utilized in order to select either decoded symbol 710 or alternate symbol 712 as data symbol 110'. As the encoding bit(s) are predefined, selector 706 may be configured to determine whether decoded symbol 710 corresponds to data symbol 110 or an alternate symbol data symbol 110 based on encoding bit(s) 112', and may then select data symbol 110' therefrom accordingly.

The original data symbol 110 scheduled for transmission at encoding circuit 100 may therefore be successfully transmitted and recovered at decoding circuit 700. Due to alternate symbol generator 104 and encoding decision block 106, data symbol 110 may be encoded in such a way to minimize the spectral noise at one or more notch frequencies. This frequency notching may be imposed in either the data-dependent spectrum or in the transition-dependent common-mode spectrum of bus data. An RF receiver component utilized encoding circuit 100 for data bus encoding may therefore reduce noise leakage in target RF bands, thereby allowing improved sensitivity for RF reception.

Figure 8:
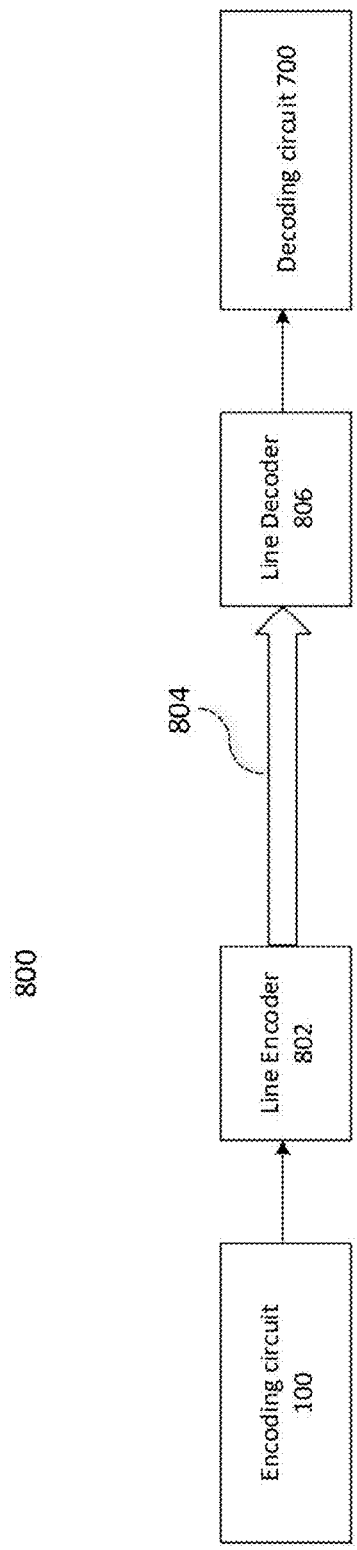
FIG. 8 shows a data bus transmission system according to an aspect of the disclosure.

FIG. 8 shows data bus transmission system 800, which includes encoding circuit 100, line encoder 802, data bus 804, line decoder 806, and decoding circuit 700. Encoding circuit 100 and decoding circuit 700 may be configured in a substantially manner as encoding circuit 100 of FIG. 1, and decoding circuit 700 of FIG. 7, respectively. Encoding circuit 100 and decoding circuit 700 may thus be configured to transmit and receive a stream of data over data bus 804 as previously detailed.

For example, encoding circuit 100 may receive a digital stream of un-encoded data to be transmitted over data bus 804. Encoding circuit 100 may add encoding bits to the original digital stream and select to transmit a series of data symbols or alternate data symbols as detailed above. Encoding circuit 100 may then provide the resulting encoded digital stream to line encoder 802, which may convert the encoded digital stream to a line-coded signal. Line encoder 802 may then transmit the line-coded signal over data bus 804, which may be e.g. a high speed data bus. It is appreciated that encoding circuit 100 and/or line encoder 802 may perform further encoding operations on the original data stream to prepare the original data stream for transmission over data bus 804, such as interleaving, addition of error-correcting code, etc.

Line decoder 806 may receive the line-coded signal at an opposite terminal of data bus 804. Line decoder 804 may then convert the line-coded signal into a digital data stream and provide the resulting digital data stream to decoding circuit 700. Decoding circuit 700 may then decode the resulting digital data stream in order to recover the original digital data stream, such as by selecting a series of data symbols or alternate data symbols in order to inverse the encoding operation of encoding circuit 100. Decoding circuit 700 may then produce a decoded digital data stream, which may be substantially the same as the original digital data stream. It is appreciated that encoding circuit 100 and decoding circuit 700 may receive a control signal, such as e.g. control signal 114, which may dictate one or more operation modes such as data-dependent or transition-dependent common-mode spectrum noise cancellation. Accordingly, data bus transmission system 800 may be capable of reducing noise caused by data bus 804 at one or more notch frequencies in the data-dependent signal or transition-dependent common-mode spectrum of the original data stream.

In addition to the third operation mode in which encoding circuit 100 produces frequency notches at a plurality of notch frequencies in either the data-dependent spectrum or transition-dependent common-mode spectrum, encoding circuit 100 may additionally be capable of producing a notch in both the data-dependent spectrum and transition-dependent common-mode spectrum simultaneously. For example, encoding decision block 106 may be configured such that $f_{notch}=f_{notch\_1}=f_{notch\_2}$, and that control signal 114 for decision block branch 500a selects input a (data-dependent spectrum, i.e. first operation mode) and control signal 114 for decision block branch 500b selects input b (transition-dependent common-mode spectrum, i.e. second operation mode). Accordingly, decision block branch 500a may calculate the phasor at $f_{notch}$ for encoded symbol 116, thereby assessing the spectral contribution of the data-dependent spectrum. Simultaneously, decision block branch 500b may calculate the phasor at $f_{notch}$ for edge-detected encoded symbol 116, thereby assessing the spectral contribution of the transition-dependent common-mode spectrum. The decision at comparator 514 may therefore be based on a spectral reduction at $f_{notch\_1}$ n both the data-dependent and transition-dependent common-mode spectrum. Accordingly, either encoded symbol 116 or alternate symbol 118 may be selected in such a manner to create a notch at $f_{notch\_1}$ n both frequency spectrums.

It is understood that alternate symbol generator 104 may be configured accordingly, as performing a logical inversion of encoded symbol 116 consistent with the first mode of operation will not be sufficient to effect the transition-dependent common-mode spectrum, regardless of any decision made by encoding decision block 106. Accordingly, in such a hybrid data-dependent signal and transition-dependent common-mode spectrum implementation, alternate symbol generator 104 may be configured to generate alternate symbol 118 as the odd-numbered bit inverted version of encoded symbol 116 in order to affect the transition-dependent common-mode spectrum. Phasor generators 506a-506c may be configured accordingly, and calculate the phasor for alternate symbol 118 based on an odd-numbered bit configuration. Encoding circuit 100 may therefore select either encoded symbol 116 or alternate symbol 118 in order to create a notch at $f_{notch\_1}$ n both the spectrums.

It is appreciated the encoding decision block may be similarly configured to create a notch in the data-dependent spectrum at $f_{notch\_1}$ and a notch in the transition-dependent common-mode spectrum at $f_{notch\_2}$ where $f_{notch\_1} \neq f_{notch\_2}$. This may be accomplished in a substantially similar manner as where $f_{notch\_1}=f_{notch\_2}$. It is appreciated that notch frequencies $f_{notch\_1}$, $f_{notch\_2}$, and $f_{notch\_3}$ may be programmable in such a manner to produce notches at a number of different notch frequencies. Numerous decision block branches such as 500a-500c may be provided in order to allow for notching at a large number of desired frequencies. It is further appreciated that the techniques described here for fully serial data bus lines can be modified to send symbols spread over parallel bus lines.

Figure 9:
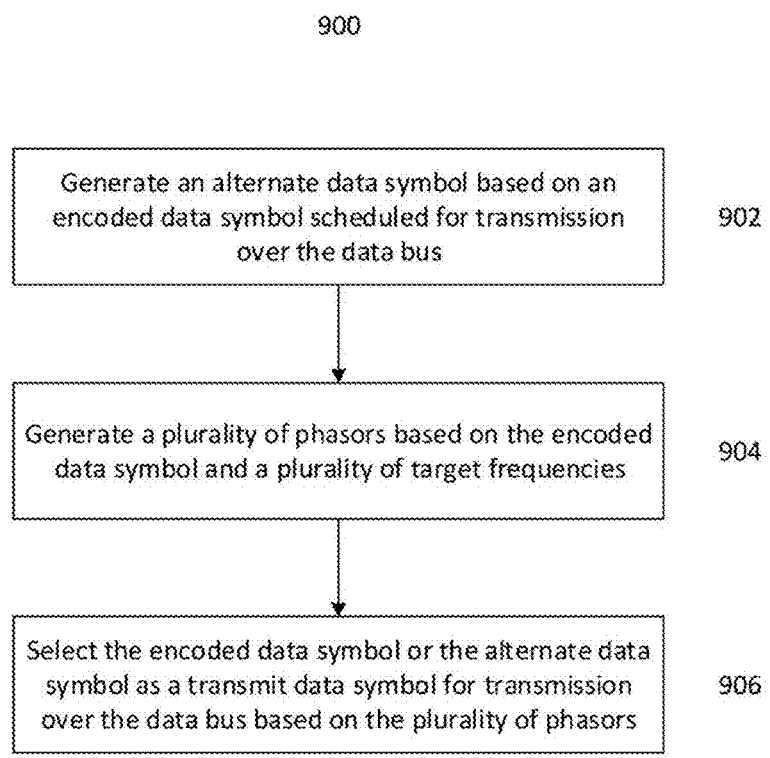
FIG. 9 shows a flow chart illustrating a method for transmitting data over a data bus according to an aspect of the disclosure.

FIG. 9 shows method 900 for transmitting data over a data bus. In 902, method 900 may generate an alternate data symbol based on an encoded data symbol scheduled for transmission over the data bus. In 904, method 900 may generate a plurality of phasors based on the encoded data symbol and a plurality of target frequencies. Method 900 may then select the encoded data symbol or the alternate data symbol as a transmit data symbol for transmission over the data bus based on the plurality of phasors in 906.

Method 900 may thus be utilized to create notches in the energy spectrum of transmitted bus data at each of the plurality of target frequencies. For example, method 900 may calculate the plurality of phasors as phasors of the encoded data symbol at the plurality of target frequencies. Method 900 may then evaluate each of the plurality of phasors (e.g. by also considering the additive inverse of each of the plurality of phasors to determine the spectral energy contribution of the inverse of the encoded data symbol) in order to select the encoded data symbol or an alternate data symbol to be transmitted over a data bus. The alternate data symbol may be an inverted version of the encoded data symbol, e.g. where one more bits of the encoded data symbol have been inverted to generate the alternate data symbol. The plurality of target frequencies may correspond to one or more frequencies being utilized for wireless reception.

In an exemplary aspect of the disclosure, method 900 may be further associated with any of the associated components of encoding circuit 100, and accordingly may perform substantially similar functionality to any related components thereof.

Figure 10:
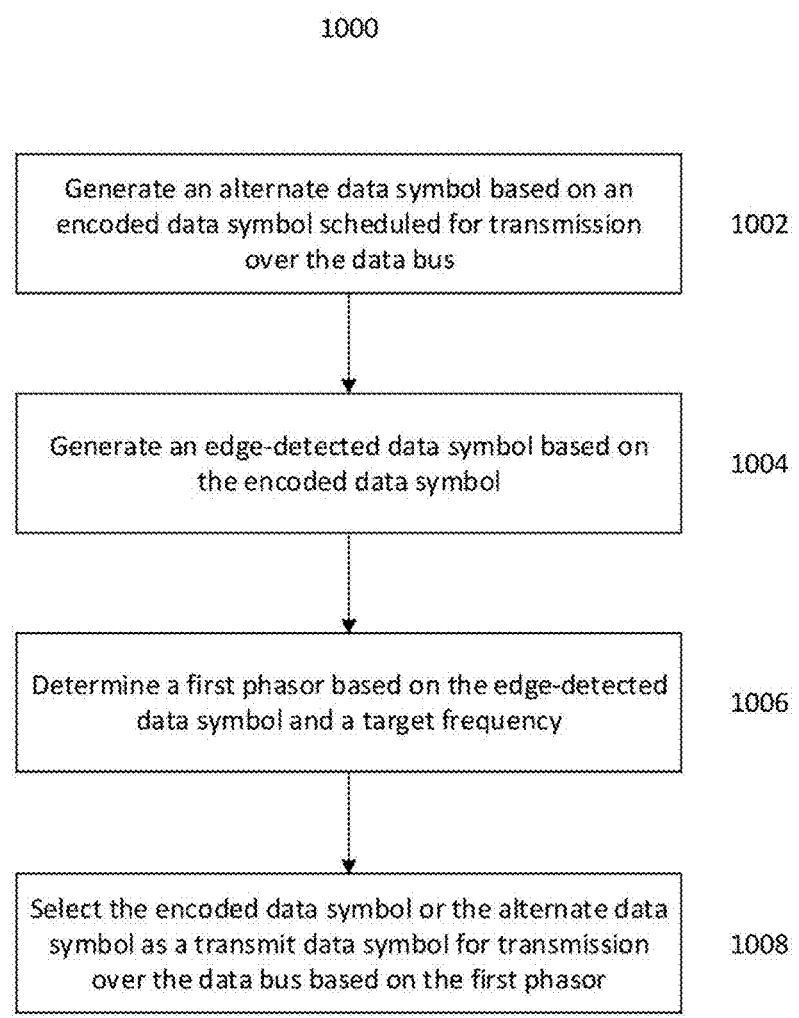
FIG. 10 shows a flow chart illustrating a method for transmitting data over a data bus according to a further aspect of the disclosure.

FIG. 10 shows method 1000 for transmitting data over a data bus. In 1002, method 1000 may generate an alternate data symbol based on an encoded data symbol scheduled for transmission over the data bus. Method 1000 may then generate an edge-detected data symbol based on the encoded data symbol in 1004. In 1006, method 1000 may determine a first phasor based on the edge-detected data symbol and a target frequency. Method 1000 may then select the encoded data symbol or the alternate data symbol as a transmit data symbol for transmission over the data bus based on the first phasor in 1008.

Method 1000 may thus be utilized to create a notch in the energy spectrum of a transition-dependent signal part. This may be accomplished by method 1000 through the use of one or more edge detectors, which may be utilized to generate an edge-detected version of an encoded data symbol. Method 1000 may then evaluate whether the encoded data symbol or an alternate data symbol will reduce the contribution to the transition-dependent energy spectrum at the target frequency. The alternate data symbol may be the odd-bit logical inversion of the encoded data symbol. The target frequency may correspond to a frequency being utilized for wireless reception.

As detailed regarding FIG. 5, creating a notch in the energy spectrum at a plurality of frequencies and/or in the transition-dependent signal part may be implemented together. Accordingly, one or more aspects of methods 900 and method 1000 may be implemented together in order to create notches at a plurality of frequencies and/or in the transition-dependent signal part.

In an exemplary aspect of the disclosure, method 1000 may be further associated with any of the associated components of encoding circuit 100, and accordingly may perform substantially similar functionality to any related components thereof.

As previously indicated, the aforementioned implementations of encoding and decoding circuits may be implemented into a variety of devices. Devices that perform wireless reception, such as e.g. devices containing wireless receivers and/or transceivers, may be particularly applicable.

Figure 11:
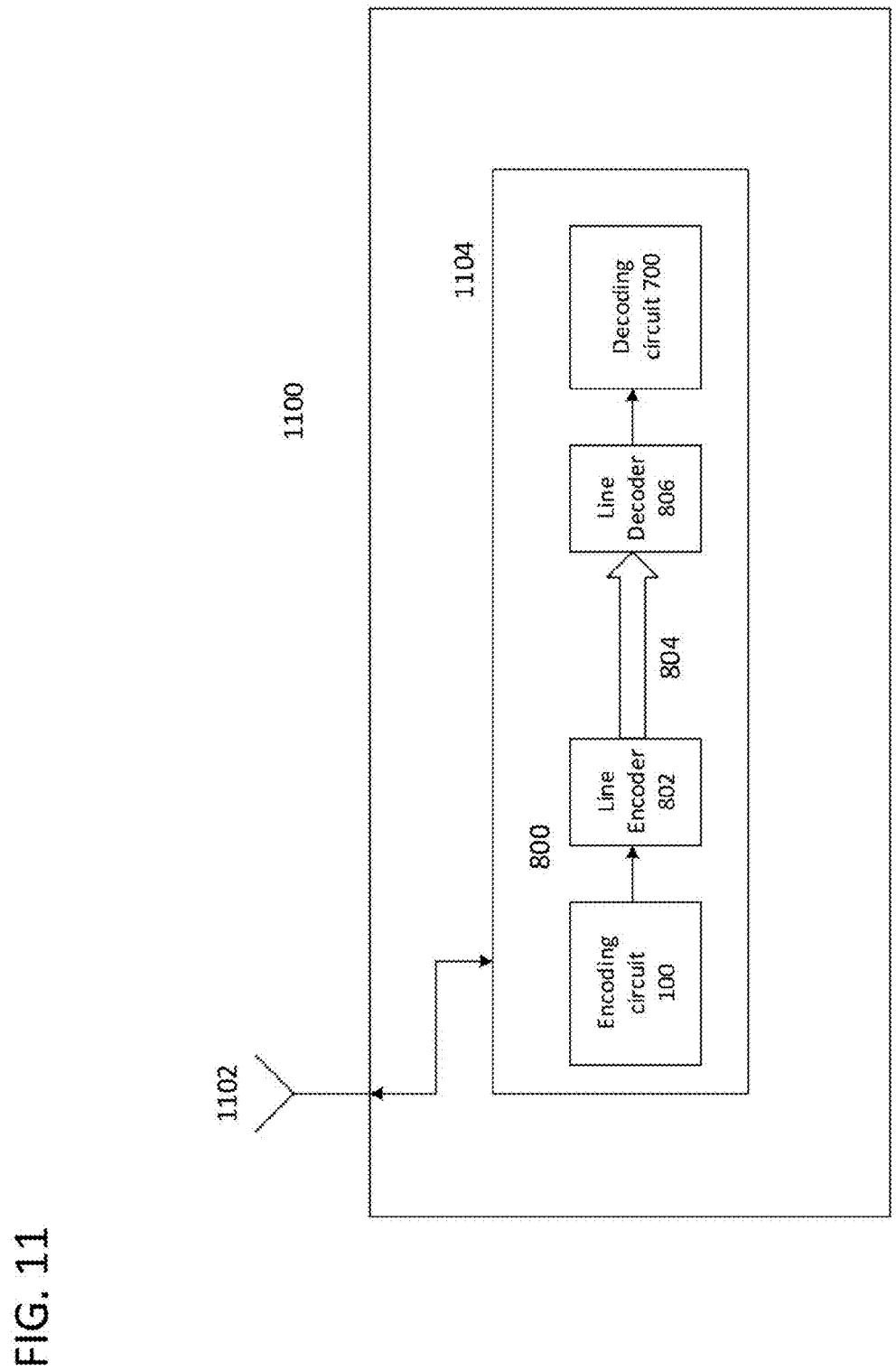
FIG. 11 shows a block diagram illustrating a radio communication device.

FIG. 11 shows a potential implementation of data bus transmission system 800 (as detailed regarding FIG. 8) implanted in radio communication device 1100. Radio communication device 1100 may be a device performing radio communications, and may be a mobile device or a substantially stationary device. In an exemplary aspect of this disclosure, radio communication device 1100 may receive GNSS satellite communications, such as GPS, GLONASS, Galileo or Beidou. Accordingly, radio communication device 1100 may configured to receive wireless signals at one or more target frequencies corresponding to the received satellite communications.

Radio communication device 1100 may be provided with one or more antennas 1102, which may be a single antenna or an antenna array. Antenna 1102 may receive wireless signals and provide resulting electrical signals to transceiver component 1104. Transceiver component 1104 may receive the resulting electrical signals and perform processing on the resulting electrical signals, such as by converting the resulting electrical signals to baseband or an intermediate frequency and performing further processing thereon, such as e.g. demodulation. Transceiver component 1104 may then provide resulting demodulated signals to one or more further components of radio communication device 1100 (not explicitly shown in FIG. 11). In the aforementioned exemplary aspect of this disclosure, the resulting demodulated signals may be processed by a component such as e.g. a GNSS processing circuit in order to process the contained GNSS communication signal.

Transceiver component 1104 may thus receive and process received radio frequency communication signals corresponding to one or more target frequencies, such as GNSS communication frequencies. In order to effectively process the received radio frequency communication signals, transceiver component 1104 may need to ensure that noise at the one or more target frequencies is kept to minimal levels.

Transceiver component 1104 may utilize one or more data buses such as data bus 804 to transport data signals within transceiver component 1104. However, the presence of data buses such as data bus 804 may introduce noise into signal transmitted thereon, which in effect may introduce noise into the received radio frequency communication signals. Accordingly, data contained at the one or more target frequencies may become corrupted by the introduction of such noise, thereby degrading receiver performance.

In order to counter the effects of such noise, transceiver component may be provided with encoding circuit 100 and decoding circuit 700 to encode and decode data transmitted over data bus 804. Accordingly, encoding circuit 100 may be configured to encode data transmitted over data bus 804 in such a manner that noise contribution at the one or more target frequencies is reduced. As previously detailed, encoding circuit 100 may be configured to send an encoded data symbol or an alternate data symbol based on the encoded data symbol following an analysis of the spectral contribution of the encoded data symbol and the alternate data symbol at one or more of the target frequencies. Encoding circuit 100 may then transmit either the encoded data symbol or the alternate data symbol based on which will minimize spectral noise contribution at one or more of the target frequencies, thereby creating a notch in the energy spectrum at the selected target frequencies. Noise contributions by data bus 804 may therefore be reduced, which may potentially result in improved receiver performance.

Encoding circuit 100 may encode data transmitted over data bus 804 in order to create notches at a plurality of target frequencies or in the transition-dependent common mode spectrum of the data. As previously detailed, encoding circuit 100 may calculate one or more phasors based on an encoded data symbol or an edge-detected version of the encoded data symbol. Encoding circuit 100 may then analyze the plurality of phasors in order to determine which of the encoded data symbol/edge-detected data symbol or a corresponding alternate data symbol will reduce the spectral contribution at the frequencies corresponding to the plurality of phasors. Decoding circuit 700 may then decode the transmitted data in order to recover the original data.

It is appreciated that the benefits of data bus transmission system 800 may be realized if placed in additional locations within radio communication device 1100, and thus is not limited to implementation in a transceiver component. Furthermore, data bus transmission system 800 is not limited to wireless receiver applications, as it is understood that the noise contribution to essentially any frequency-sensitive data may be improved through the use of data bus transmission system 800 (in particular encoding circuit 100).

In a first exemplary aspect of the disclosure, radio communication circuit 1100 may include an encoding circuit (encoding circuit 100) configured to select a transmit data symbol for transmission over a data bus (data bus 804), and a decoding circuit (decoding circuit 700) configured to receive data over the data bus, wherein the encoding circuit comprises an alternate symbol generation circuit configured to generate an alternate data symbol based on an encoded data symbol scheduled for transmission over the data bus, and a decision circuit configured to select the encoded data symbol or the alternate data symbol as the transmit data symbol based on a plurality of phasors, wherein the decision circuit comprises a plurality of phasor generation circuits configured to generate the plurality of phasors based on the encoded data symbol and a plurality of target frequencies.

Radio communication device 1100 may therefore include in a second exemplary aspect of the disclosure an encoding circuit (encoding circuit 100) configured to select a transmit data symbol for transmission over a data bus (data bus 800), and a decoding circuit (decoding circuit 700) configured to receive data over the data bus, wherein the encoding circuit comprises an alternate symbol generation circuit configured to generate an alternate data symbol based on the encoded data symbol scheduled for transmission over the data bus, and a decision circuit configured to select the encoded data symbol or the alternate data symbol as the transmit data symbol based on a first phasor, wherein the decision circuit comprises an edge detection circuit configured to generate an edge-detected data symbol based on the encoded data symbol and a phasor generation circuit configured to determine the first phasor based on the edge-detected data symbol and a target frequency.

The following examples pertain to further aspects of this disclosure:

Example 1 is an encoding circuit. The encoding circuit is configured to select a transmit data symbol for transmission over a data bus, and includes an alternate symbol generation circuit configured to generate an alternate data symbol based on an encoded data symbol scheduled for transmission over the data bus, and a decision circuit configured to select the encoded data symbol or the alternate data symbol as the transmit symbol based on a plurality of phasors. The decision circuit includes a plurality of phasor generation circuits configured to generate the plurality of phasors based on the encoded data symbol and a plurality of target frequencies.

In Example 2, the subject matter of Example 1 can optionally include wherein the decision circuit is configured to select the encoded data symbol or the alternate data symbol as the transmit symbol based on an analysis of the plurality of phasors.

In Example 3, the subject matter of Example 1 can optionally include wherein the decision circuit is configured to select the encoded data symbol or the alternate data symbol as the transmit symbol based on whether transmission of the encoded data symbol or the alternate data symbol will reduce a cumulative phasor over time at one at one or more of the plurality of target frequencies.

In Example 4, the subject matter of Example 1 can optionally include wherein each of the phasor generation circuits is configured to generate a respective phasor of the plurality of phasors by calculating the phasor of the encoded data symbol at a respective target frequency of the plurality of target frequencies.

In Example 5, the subject matter of Example 1 can optionally include wherein a first phasor generation circuit of the plurality of phasor generation circuits is configured to generate a first phasor of the plurality of phasors by calculating the phasor of the encoded data symbol at a first target frequency of the plurality of target frequencies.

In Example 6, the subject matter of Example 5 can optionally include wherein a second phasor generation circuit of the plurality of phasor generation circuits is configured to generate a second phasor of the plurality of phasors by calculating the phasor of the encoded data symbol at a second target frequency of the plurality of target frequencies.

In Example 7, the subject matter of Example 6 can optionally include wherein the decision circuit is configured to select the encoded data symbol or the alternate data symbol as the transmit symbol based on the first phasor and the second phasor.

In Example 8, the subject matter of Example 5 can optionally include wherein a second phasor generation circuit is configured to generate a second phasor of the plurality of phasors by calculating the phasor of an edge-detected data symbol at a second target frequency of the plurality of target frequencies.

In Example 9, the subject matter of Example 8 can optionally include wherein the first target frequency is substantially equal to the second target frequency.

In Example 8, the subject matter of Example 9 can optionally include wherein the first target frequency is different than the second target frequency.

In Example 11, the subject matter of Example 1 can optionally include wherein the decision circuit further includes a plurality of integrator circuits each configured to generate a first adjusted integral phasor and a second adjusted integral phasor.

In Example 12, the subject matter of Example 11 can optionally include wherein each of the plurality of integrator circuits is coupled to a respective phasor generation circuit of the plurality of phasor generation circuits and configured to receive a respective phasor from the respective phasor generation circuit.

In Example 13, the subject matter of Example 12 can optionally include wherein each of the plurality of integrator circuits is configured to generate a phasor of the alternate data symbol at a respective target frequency of the plurality of target frequencies by calculating the additive inverse of the phasor of the encoded data symbol at the respective target frequency of the plurality of target frequencies.

In Example 14, the subject matter of Example 12 can optionally include wherein each of the plurality of integrator circuits is configured to generate the first adjusted integral phasor by adding the respective phasor to an integrated phasor value and generate the second adjusted integral phasor by subtracting the respective phasor from the integrated phasor value.

In Example 15, the subject matter of Example 14 can optionally include wherein the integrated phasor value is a historical integrated phasor over time of previously transmitted transmit symbols at a respective target frequency of the plurality of target frequencies.

In Example 16, the subject matter of Example 11 can optionally include wherein the first adjusted integral phasor is associated with the encoded data symbol and the second adjusted integral phasor is associated with the alternate data symbol.

In Example 17, the subject matter of Example 11 can optionally include wherein the decision circuit further includes a first summing circuit and a second summing circuit, and wherein the first summing circuit is configured to calculate a first sum based on the first adjusted integral phasors generated by each of the plurality of integrator circuits and the second summing circuit is configured to calculate a second sum based on the second adjusted integral phasors generated by each of the plurality of integrator circuits.

In Example 18, the subject matter of Example 17 can optionally include wherein the decision circuit further includes an evaluation circuit configured to perform an evaluation of the first sum and the second sum, and wherein the decision circuit is configured to select the encoded data symbol or the alternate data symbol as the transmit symbol based on the evaluation.

In Example 19, the subject matter of Example 18 can optionally include wherein the evaluation circuit is configured to select the encoded data symbol or the alternate data symbol as the transmit symbol based whether the magnitude of the first sum is greater than the magnitude of the second sum.

In Example 20, the subject matter of Example 17 can optionally include wherein the decision circuit further includes one or more weighting circuits configured to apply a weighting coefficient to the first adjusted integral phasors and the second adjusted integral phasors generated by each of the plurality of integrator circuits to generate a plurality of weighted integral phasors.

In Example 21, the subject matter of Example 20 can optionally include wherein the first summing circuit is configured to calculate a first sum based on the plurality of weighted integral phasors and the second summing circuit is configured to calculate a second sum based on the plurality of weighted integral phasors.

In Example 22, the subject matter of Example 1 can optionally include further including a combining circuit configured to generate the encoded data symbol by combining a source data symbol with one or more encoding bits.

In Example 23, the subject matter of Example 1 can optionally include wherein the alternate symbol generation circuit includes at least one inverting circuit, and wherein the alternate symbol generation circuit is configured to generate the alternate data symbol by logically inverting at least one bit of the encoded data symbol.

In Example 24, the subject matter of Example 1 can optionally include wherein the alternate symbol generation circuit is an inverting circuit, and wherein the alternate data symbol is the logical bitwise inversion of the encoded data symbol.

In Example 25, the subject matter of Example 1 can optionally include wherein each of the plurality of target frequencies corresponds to one or more radio frequency bands used to receive wireless signals.

In Example 26, the subject matter of Example 1 can optionally include wherein at least one of the plurality of target frequencies corresponds to a Global Navigation Satellite System receiving frequency.

In Example 27, the subject matter of Example 1 can optionally further include a selection circuit, and wherein the decision circuit is configured to supply the selection circuit with an encoding control signal indicating the selection of the encoded data symbol or the alternate data symbol.

In Example 28, the subject matter of Example 27 can optionally include wherein the decision circuit is configured to supply the selection circuit with the encoding control signal based on an analysis of the plurality of phasors.

In Example 29, the subject matter of Example 1 can optionally include wherein each phasor of the plurality of phasors is the phasor of an edge-detected data symbol at the respective target frequency of the plurality of target frequencies.

In Example 30, the subject matter of Example 1 can optionally include wherein the decision circuit further includes a plurality of edge detection circuits configured to generate a plurality of edge-detected data symbols, and wherein each of the plurality of phasor generation is configured to generate a respective phasor of the plurality of phasors by determining the phasor of an edge-detected data symbol of the plurality of edge-detected data symbols at a respective target frequency of the plurality of target frequencies.

In Example 31, the subject matter of Example 30 can optionally include wherein each of the plurality of edge-detection circuits includes a unit delay circuit configured to accept a feedback bit as input, a selecting circuit configured to select one or more leading bits of the encoded data symbol, a combining circuit configured to combine the feedback bit with the one or more leading bits of the encoded data symbol to produce a shifted data symbol, a logical operation circuit configured to perform a logical XOR operation on the encoded data symbol and the shifted data symbol to generate an edge-detected data symbol of the plurality of edge-detected data symbols.

In Example 32, the subject matter of Example 1 can optionally include wherein the alternate symbol generation circuit includes a selection circuit configured to select the odd-numbered bits of the encoded data symbol, and an inverting circuit configured to logically invert the odd-numbered bits of the encoded data symbol.

In Example 33, the subject matter of Example 1 can optionally include wherein the decision circuit further includes a first edge detection circuit configure to generate a first edge-detected data symbol based on the encoded data symbol, and a first mode selection circuit configured to provide the encoded data symbol or the first edge-detected data symbol to a first phasor generation circuit of the plurality of phasor generation circuits based on a first control signal.

In Example 34, the subject matter of Example 33 can optionally include wherein the decision circuit further includes a second edge detection circuit configured to generate a second edge-detected data symbol based on the encoded data symbol, and a second mode selection circuit configured to provide the encoded data symbol or the second edge-detected data symbol to a second phasor generation circuit of the plurality of phasor generation circuits based on a second control signal.

In Example 35, the subject matter of Example 34 can optionally include wherein the first mode selection circuit is configured to provide the encoded data symbol to the first phasor generation circuit according to the first control input signal and the second mode selection circuit is configured to provide the second edge-detected data symbol to the second phasor generation circuit according to the first control input signal, and wherein the decision circuit is configured to select the encoded data symbol or the alternate data symbol as the transmit data symbol based on a first phasor generated by the first phasor generation circuit and a second phasor generated by the second phasor generation circuit.

In Example 36, the subject matter of Example 35 can optionally include wherein the first phasor generation circuit is configured to generate the first phasor of the encoded data symbol at a first target frequency of the plurality of target frequencies and the second phasor generation circuit is configured to generate the second phasor of the edge-detected data symbol at a second target frequency of the plurality of target frequencies.

In Example 37, the subject matter of Example 36 can optionally include wherein the first target frequency is substantially equal to the second target frequency.

In Example 38, the subject matter of Example 36 can optionally include wherein the first target frequency is different from the second target frequency.

In Example 39, the subject matter of Example 1 can optionally include wherein the decision circuit further includes a first edge detection circuit configured to generate a first edge-detected data symbol based on the encoded data symbol, and wherein a first phasor generation circuit of the plurality of phasor generation circuits is configured to generate a first phasor of the first edge-detected data symbol at a first target frequency of the plurality of target frequencies and a second phasor generation circuit of the plurality of phasor generation circuits is configured to generate a second phasor of the encoded data symbol at a second target frequency of the plurality of target frequencies.

In Example 40, the subject matter of Example 36 can optionally include wherein the first target frequency is substantially equal to the second target frequency.

In Example 41, the subject matter of Example 36 can optionally include wherein the first target frequency is different than the second target frequency.

In Example 42, the subject matter of Example 1 can optionally include wherein the alternate symbol generation circuit is controlled by a control signal, and wherein the alternate symbol generation circuit is configured to logically invert one or more bits of the encoded data symbol based on the control signal in order to generate the alternate data symbol.

In Example 43, the subject matter of Example 1 can optionally include further including a plurality of mode selection circuits, wherein each of the plurality of mode selection circuits is configured to provide a phasor generation circuit of the plurality of phasor generation circuits with the encoded data symbol or an edge-detected data symbol.

In Example 44, the subject matter of Example 1 can optionally further include a plurality of mode selection circuits, wherein each of the plurality of mode selection circuits is configured to provide a phasor generation circuit of the plurality of phasor generation circuits with the encoded data symbol or an edge-detected data symbol according to a mode selection control signal.

In Example 45, the subject matter of Example 44 can optionally include wherein the edge-detected data symbol is based on the encoded data symbol, and wherein each of the plurality of phasor generation circuits are configured to generate the phasor of the plurality of phasors based on the encoded data symbol or the edge-detected data symbol.

In Example 46, the subject matter of Example 44 can optionally include wherein the alternate symbol generation circuit is configured to generate the alternate data symbol based on the encoded data symbol according to the mode selection control signal.

In Example 47, the subject matter of Example 1 can optionally include wherein the alternate symbol generation circuit is configured to generate the alternate data symbol based on the encoded data symbol according to a mode selection control signal.

In Example 48, the subject matter of Example 47 can optionally include wherein the alternate symbol generation is configured to generate the alternate data symbol by logically inverting one or more bits of the encoded data symbol according to the mode selection control signal.

Example 49 is an encoding circuit. The encoding circuit is configured to select a transmit data symbol for transmission over a data bus, and includes an alternate symbol generation circuit configured to generate an alternate data symbol based on the encoded data symbol scheduled for transmission over the data bus, and a decision circuit configured to select the encoded data symbol or the alternate data symbol as the transmit symbol based on a first phasor. The decision circuit includes an edge detection circuit configured to generate an edge-detected data symbol based on the encoded data symbol, and a phasor generation circuit configured to determine the first phasor based on the edge-detected data symbol and a target frequency.

In Example 50, the subject matter of Example 49 can optionally include wherein the decision circuit is configured to select the encoded data symbol or the alternate data symbol as the transmit symbol based on whether transmission of the encoded data symbol or the alternate data symbol will reduce a cumulative phasor over time at the target frequency.

In Example 51, the subject matter of Example 49 can optionally include wherein the phasor generation circuit is configured to determine the first phasor by determining a phasor of the edge-detected data symbol at the target frequency.

In Example 52, the subject matter of Example 49 can optionally include wherein the decision circuit further includes an integrator circuit configured to generate a first adjusted integral phasor and a second adjusted integral phasor based on the first phasor.

In Example 53, the subject matter of Example 52 can optionally include wherein the integrator circuit is configured to generate the first adjusted integral phasor by adding the first phasor to a historical integrated phasor, and generate the second adjusted integral phasor by subtracting the first phasor from a historical integrated phasor.

In Example 54, the subject matter of Example 53 can optionally include wherein the historical integrated phasor is an integrated phasor over time of previously transmitted transmit data symbols at the target frequency.

In Example 55, the subject matter of Example 53 can optionally include wherein the decision circuit is configured to select the encoded data symbol or the alternate data symbol as the transmit symbol based on whether the first adjusted integral phasor is greater than the second adjusted integral phasor.

In Example 56, the subject matter of Example 55 can optionally include wherein the decision circuit further includes an evaluation circuit configured to determine whether the first adjusted integral phasor is greater than the second adjusted integral phasor.

In Example 57, the subject matter of Example 49 can optionally include wherein the decision circuit further includes an additional phasor generation circuit configured to determine a second phasor based on the edge-detected data symbol and an additional target frequency.

In Example 58, the subject matter of Example 57 can optionally include wherein the decision circuit is configured to select the encoded data symbol or the alternate data symbol as the transmit symbol based on the first phasor and the second phasor.

In Example 59, the subject matter of Example 58 can optionally include wherein the decision circuit further includes a plurality of integrator circuits each configured to generate a first adjusted integral phasor and a second adjusted integral phasor based on the edge-detected data symbol and a respective target frequency of a plurality of target frequencies.

In Example 60, the subject matter of Example 59 can optionally include wherein each of the plurality of integrator circuits is configured to generate a first adjusted integral phasor by adding a phasor of the edge-detected data symbol at a respective target frequency of the plurality of target frequencies to a historical integrated phasor, and generate a second adjusted integral phasor by subtracting a phasor of the edge-detected data symbol at the respective target frequency of the plurality of target frequencies to the historical integrated phasor.

In Example 61, the subject matter of Example 60 can optionally include wherein each of the first adjusted integral phasors generated by the plurality of integrator circuits is associated with the edge-detected data symbol and each of the second adjusted integral phasors generated by the plurality of integrator circuits is associated with the alternate data symbol.

In Example 62, the subject matter of Example 60 can optionally include wherein the encoding circuit further includes a first summing circuit configured to calculate a first sum based on the first adjusted integral phasors generated by each of the plurality of integrator circuits, and a second summing circuit configured to calculate a second sum based on the second adjusted integral phasors generated by each of the plurality of integrator circuits.

In Example 63, the subject matter of Example 62 can optionally include wherein the decision circuit is configured to select the encoded data symbol or the alternate data symbol as the transmit symbol based on the first sum and the second sum.

In Example 64, the subject matter of Example 62 can optionally include wherein the decision circuit is configured to select the encoded data symbol or the alternate data symbol as the transmit symbol based on whether the first sum is greater than the second sum.

In Example 65, the subject matter of Example 64 can optionally include wherein the decision circuit further includes an evaluation circuit configured to determine whether the first sum is greater than the second sum.

In Example 66, the subject matter of Example 49 can optionally further include a combining circuit configured to generate the encoded data symbol by combining a source data symbol with one or more encoding bits.

In Example 67, the subject matter of Example 49 can optionally include wherein the alternate symbol generation circuit includes at least one inverting circuit, and wherein the alternate symbol generation circuit is configured to generate the alternate data symbol by logically inverting at least one bit of the encoded data symbol.

In Example 68, the subject matter of Example 49 can optionally include wherein the alternate symbol generation circuit is configured to invert bits at odd-numbered positions of the encoded data symbol.

In Example 69, the subject matter of Example 49 can optionally include wherein the target frequency corresponds to a radio frequency band used to receive wireless signals.

In Example 70, the subject matter of Example 49 can optionally include wherein the target frequency corresponds to a Global Navigation Satellite System receiving frequency.

In Example 71, the subject matter of Example 49 can optionally include further including a selection circuit, and wherein the decision circuit is configured to supply the selection circuit with an encoding control signal indicating the selection of the encoded data symbol or the alternate data symbol.

In Example 72, the subject matter of Example 71 can optionally include wherein the decision circuit is configured to supply the selection circuit with the encoding control signal based on an analysis of the plurality of phasors.

In Example 73, the subject matter of Example 49 can optionally include wherein the decision circuit further includes an additional edge detection circuit configured to generate an additional edge-detected data symbol based on the encoded data symbol, an additional phasor generation circuit configured to determine a second phasor based on the additional edge-detected data symbol and an additional target frequency, wherein the decision circuit is configured to select the encoded data symbol or the alternate data symbol based on the first phasor and the second phasor.

In Example 74, the subject matter of Example 49 can optionally include wherein the edge detection circuit includes a unit delay circuit configured to accept a feedback bit as input, a selecting circuit configured to select one or more leading bits of the encoded data symbol, a combining circuit configured to combine the feedback bit with the one or more leading bits of the encoded data symbol to produce a shifted data symbol, and a logical operation circuit configured to perform a logical XOR operation on the encoded data symbol and the shifted data symbol to generate an edge-detected data symbol of the plurality of edge-detected data symbols.

In Example 75, the subject matter of Example 49 can optionally include wherein the alternate data symbol generation circuit includes a selection circuit configured to select the odd-numbered bits of the encoded data symbol, and an inverting circuit configured to logically invert the odd-numbered bits of the encoded data symbol.

In Example 76, the subject matter of Example 49 can optionally include wherein the phasor generation circuit is configured to determine a second phasor based on a further encoded data symbol and the target frequency, and wherein the decision circuit is configured to select the further encoded data symbol or a further alternate data symbol as a further transmit data symbol based on the second phasor.

In Example 77, the subject matter of Example 76 can optionally include wherein the alternate symbol generation circuit is configured to generate the further alternate data symbol based on the further encoded data symbol.

In Example 78, the subject matter of Example 49 can optionally include wherein the phasor generation circuit is configured to determine a second phasor at the target frequency based on a further encoded data symbol or a further edge-detected data symbol according to a mode control signal.

In Example 79, the subject matter of Example 78 can optionally include further including a mode selection circuit configured to provide the further encoded data symbol or the further edge-detected data symbol to the phasor generation circuit according to the mode control signal.

In Example 80, the subject matter of Example 79 can optionally include wherein the decision circuit is configured to select the further encoded data symbol or a further alternate symbol as a further transmit symbol based on the second phasor.

In Example 81, the subject matter of Example 80 can optionally include wherein the alternate symbol generation circuit is configured to generate the further alternate data symbol based on the further encoded data symbol.

In Example 82, the subject matter of Example 80 can optionally include wherein the edge-detection circuit is configured to generate the further edge-detected data symbol based on the further encoded data symbol.

In Example 83, the subject matter of Example 80 can optionally include wherein the decision circuit further includes an integrator circuit configured to generate a first adjusted integral phasor and a second adjusted integral phasor based on the first phasor and the second phasor.

In Example 84, the subject matter of Example 80 can optionally include wherein the integrator circuit is configured to generate the first adjusted integral phasor by adding the second phasor to a historical integrated phasor, and generate the second adjusted integral phasor by subtracting the second phasor from a historical integrated phasor, wherein the historical integrated phasor is based in part on the first phasor.

In Example 85, the subject matter of Example 84 can optionally include wherein the historical integrated phasor is an integrated phasor over time of previously transmitted transmit data symbols at the target frequency.

In Example 86, the subject matter of Example 84 can optionally include wherein the decision circuit is configured to select the further encoded data symbol or the further alternate data symbol as the further transmit symbol based on whether the first adjusted integral phasor is greater than the second adjusted integral phasor.

In Example 87, the subject matter of Example 86 can optionally include wherein the decision circuit further includes an evaluation circuit configured to determine whether the first adjusted integral phasor is greater than the second adjusted integral phasor.

Example 88 is an encoding circuit. The encoding circuit is configured to select a transmit data symbol for transmission over a data bus, and includes an alternate symbol generation circuit configured to generate an alternate data symbol based on an encoded data symbol scheduled for transmission over the data bus, and a decision circuit configured to select the encoded data symbol or the alternate data symbol as the transmit symbol based on a plurality of phasors, wherein the decision circuit includes a plurality of edge detection circuits configured to generate a plurality of edge-detected data symbols based on the encoded data symbol, and a plurality of phasor generation circuits configured to generate the plurality of phasors based on the encoded data symbol and a plurality of target frequencies.

In Example 89, the subject matter of Example 88 can optionally include wherein the decision circuit is configured to select the encoded data symbol or the alternate data symbol as the transmit symbol based on an analysis of the plurality of phasors.

In Example 90, the subject matter of Example 88 can optionally include wherein the decision circuit is configured to select the encoded data symbol or the alternate data symbol as the transmit symbol based on whether transmission of the encoded data symbol or the alternate data symbol will reduce a cumulative phasor over time at one at one or more of the plurality of target frequencies.

In Example 91, the subject matter of Example 88 can optionally include wherein each of the plurality of edge detection circuits is configured to generate a respective edge-detected data symbol of the plurality of edge-detected data symbols based on the encoded data symbol.

In Example 92, the subject matter of Example 91 can optionally include wherein each of the plurality of phasor generation circuits is configured to generate a respective phasor of the plurality of phasors based on the encoded data symbol and a respective frequency of the plurality of target frequencies.

In Example 93, the subject matter of Example 88 can optionally include wherein each of the plurality of phasor generation circuits is configured to generate a respective phasor of the plurality of phasors based on the encoded data symbol and a respective frequency of the plurality of target frequencies.

In Example 94, the subject matter of Example 88 can optionally include wherein the alternate symbol generation circuit includes at least one logical inverter, and wherein the alternate symbol generation circuit is configured to logically invert one or more bits of the encoded data symbol to generate the alternate data symbol based on a mode control signal.

In Example 95, the subject matter of Example 94 can optionally include wherein the alternate symbol generation circuit is configured to logically invert every bit of the encoded data symbol to generate the alternate data symbol if the mode control signal indicates a first mode of operation.

In Example 96, the subject matter of Example 95 can optionally include wherein the alternate symbol generation circuit is configured to logically invert every-other bit of the encoded data symbol to generate the alternate data symbol if the mode control signal indicates a second mode of operation.

In Example 97, the subject matter of Example 88 can optionally include wherein each of the plurality of phasor generation circuits is configured to generate a respective phasor of the plurality of phasors by calculating a phasor of the encoded data symbol or a respective edge-detected data symbol of the plurality of edge-detected data symbols at a respective target frequency of the plurality of target frequencies.

In Example 98, the subject matter of Example 97 can optionally include wherein each of the plurality of phasor generation circuits is configured to calculate a phasor of the encoded data symbol or the respective edge-detected data symbol of the plurality of edge-detected data symbols according to a mode control signal.

In Example 99, the subject matter of Example 98 can optionally include wherein the decision circuit further includes a plurality of mode selection circuits each coupled to a respective phasor generation circuit of the plurality of phasor generation circuits, wherein each of the plurality of mode selection circuits is configured to provide the respective phasor generation circuit of the plurality of phasor generation circuits with the encoded data symbol or the respective edge-detected data symbol of the plurality of edge-detected data symbols based on a mode control signal.

In Example 100, the subject matter of Example 98 can optionally include wherein the decision circuit further includes a plurality of mode selection circuits each coupled to a respective phasor generation circuit of the plurality of phasor generation circuits, and wherein each of the mode selection circuits is configured to receive a respective mode control signal of a plurality of mode control signals, and provide the respective phasor generation circuit of the plurality of phasor generation circuits with the encoded data symbol or the respective edge-detected data symbol of the plurality of edge-detected data symbols based on a mode control signal.

In Example 101, the subject matter of Example 88 can optionally include wherein the decision circuit further includes a plurality of integrator circuits each configured to generate a first adjusted integrated phasor and a second adjusted integrated phasor.

In Example 102, the subject matter of Example 101 can optionally include wherein each of the plurality of integrator circuits is coupled to a respective phasor generation circuit of the plurality of phasor generation circuits and configured to receive a respective phasor of the plurality of phasors from the respective phasor generation circuit, generate the first adjusted integrated phasor by adding the respective phasor to a respective historical integrated phasor of a plurality of historical integrated phasors, and generate the second adjusted integrated phasor by subtracting the respective phasor from the respective historical integrated phasor of the plurality of historical integrated phasors.

In Example 103, the subject matter of Example 102 can optionally include wherein decision circuit further includes a first summing circuit and a second summing circuit, and wherein the first summing circuit is configured to generate a first sum based on the first adjusted integrated phasors generated by each of the plurality of integrator circuits and the second summing circuit is configured to generate a second sum based on the second adjusted integrated phasors generated by each of the plurality of integrator circuits.

In Example 104, the subject matter of Example 103 can optionally include wherein the decision circuit is configured to select the encoded data symbol or the alternate data symbol as the transmit symbol based on the first sum and the second sum.

In Example 105, the subject matter of Example 104 can optionally include wherein the decision circuit is configured to select the encoded data symbol or the alternate data symbol as the transmit symbol based on whether the first sum is greater than the second sum.

In Example 106, the subject matter of Example 105 can optionally include wherein the decision circuit further includes an evaluation circuit configured to determine whether the first sum is greater than the second sum.

In Example 107, the subject matter of Example 102 can optionally include wherein each historical integrated phasor of the plurality of integrated phasors is an integrated phasor over time of previously transmitted transmit data symbols at a respective target frequency of the plurality of target frequencies.

In Example 108, the subject matter of Example 88 can optionally include wherein one or more of the plurality of target frequencies corresponds to a frequency band used to receive wireless signals.

In Example 109, the subject matter of Example 88 can optionally include wherein at least one of the plurality of target frequencies corresponds to a Global Navigation Satellite System receiving frequency In Example 110, the subject matter of Example 88 can optionally include wherein each of the plurality of edge-detection circuits includes a unit delay circuit configured to accept a feedback bit as input, a selecting circuit configured to select one or more leading bits of the encoded data symbol, a combining circuit configured to combine the feedback bit with the one or more leading bits of the encoded data symbol to produce a shifted data symbol, and logical operation circuit configured to perform a logical XOR operation on the encoded data symbol and the shifted data symbol to generate an edge-detected data symbol of the plurality of edge-detected data symbols.

In Example 111, the subject matter of Example 88 can optionally further include a selection circuit, and wherein the decision circuit is configured to supply the selection circuit with an encoding control signal indicating the selection of the encoded data symbol or the alternate data symbol.

In Example 112, the subject matter of Example 111 can optionally include wherein the decision circuit is configured to supply the selection circuit with the encoding control signal based on an analysis of the plurality of phasors.

Example 113 is a radio communication device. The radio communication device includes an encoding circuit configured to select a transmit data symbol for transmission over a data bus, and a decoding circuit configured to receive data over the data bus, wherein the encoding circuit includes an alternate symbol generation circuit configured to generate an alternate data symbol based on an encoded data symbol scheduled for transmission over the data bus, and a decision circuit configured to select the encoded data symbol or the alternate data symbol as the transmit data symbol based on a plurality of phasors, wherein the decision circuit includes a plurality of phasor generation circuits configured to generate the plurality of phasors based on the encoded data symbol and a plurality of target frequencies.

In Example 114, the subject matter of Example of 113 can optionally include wherein the encoding circuit, the decoding circuit, and the data bus are components of a transceiver device of the radio communication device.

In Example 115, the subject matter of Example 114 can optionally include wherein one or more of the plurality of target frequencies correspond to one or more reception frequencies associated with the transceiver device.

In Example 116, the subject matter of Example 114 can optionally include wherein one or more of the plurality of target frequencies correspond to a Global Navigation Satellite system receiving frequency associated with the transceiver device.

In Example 117, the subject matter of Example 113 can optionally include wherein the decision circuit is configured to select the encoded data symbol or the alternate data symbol as the transmit data symbol based on whether transmission of the encoded data symbol or the alternate data symbol will reduce a cumulative phasor over time at one or more of the plurality of target frequencies.

In Example 118, the subject matter of Example 113 can optionally include wherein a first phasor generation circuit of the plurality of phasor generation circuits is configured to generate a first phasor of the plurality of phasors by calculating the phasor of the encoded data symbol at a first target frequency of the plurality of target frequencies.

In Example 119, the subject matter of Example 118 can optionally include wherein a second phasor generation circuit of the plurality of phasor generation circuits is configured to generate a second phasor of the plurality of phasors by calculating the phasor of the encoded data symbol at a second target frequency of the plurality of target frequencies.

In Example 120, the subject matter of Example 119 can optionally include wherein the decision circuit is configured to select the encoded data symbol or the alternate data symbol as the transmit data symbol based on the first phasor and the second phasor.

In Example 121, the subject matter of Example 118 can optionally include wherein a second phasor generation circuit is configured to generate a second phasor of the plurality of phasors by calculating the phasor of an edge-detected data symbol at a second target frequency of the plurality of target frequencies.

In Example 122, the subject matter of Example 121 can optionally include wherein the first target frequency is substantially equal to the second target frequency.

In Example 123, the subject matter of Example 121 can optionally include wherein the first target frequency is different than the second target frequency.

In Example 124, the subject matter of Example 113 can optionally include wherein the alternate symbol generation circuit includes at least one inverting circuit, and wherein the alternate symbol generation circuit is configured to generate the alternate data symbol by logically inverting at least one bit of the encoded data symbol.

In Example 125, the subject matter of Example 113 can optionally include wherein the decision circuit is configured to select the encoded data symbol or the alternate data symbol as the transmit data symbol based on an analysis of the plurality of phasors.

In Example 126, the subject matter of Example 113 can optionally include wherein each of the phasor generation circuits is configured to generate a respective phasor of the plurality of phasors by calculating the phasor of the encoded data symbol at a respective target frequency of the plurality of target frequencies.

In Example 127, the subject matter of Example 113 can optionally include wherein the decoding circuit is configured to receive a receive data symbol corresponding to the transmit data symbol over the data bus.

In Example 128, the subject matter of Example 127 can optionally include wherein the decoding circuit is configured to generate a decoded data symbol based on the receive data symbol.

In Example 129, the subject matter of Example 127 can optionally include wherein the decoding circuit is configured to generate a decoded data symbol as the receive data symbol or an inverted receive data symbol.

In Example 130, the subject matter of Example 129 can optionally include wherein the decoding circuit is configured generate a decoded data symbol as the receive data symbol or an inverted receive data symbol based on one or more encoding bits of the receive data symbol.

In Example 131, the subject matter of Example 127 can optionally include wherein the decoding circuit is configured to generate a decoded data symbol as the receive data symbol or an odd-bit inverted receive data symbol.

In Example 132, the subject matter of Example 131 can optionally include wherein the decoding circuit is configured generate a decoded data symbol as the receive data symbol or an odd-bit inverted receive data symbol based on one or more encoding bits of the receive data symbol.

In Example 133, the subject matter of Example 128 can optionally include wherein the decoding circuit includes at least one inverting circuit, and wherein the decoding circuit is configured to apply the at least one inverting circuit to invert one or more bits of the receive data symbol to generate the decoded data symbol.

Example 134 is a radio communication device. The radio communication device includes an encoding circuit configured to select a transmit data symbol for transmission over a data bus, and a decoding circuit configured to receive data over the data bus, wherein the encoding circuit includes an alternate symbol generation circuit configured to generate an alternate data symbol based on the encoded data symbol scheduled for transmission over the data bus, and a decision circuit configured to select the encoded data symbol or the alternate data symbol as the transmit data symbol based on a first phasor, wherein the decision circuit includes an edge detection circuit configured to generate an edge-detected data symbol based on the encoded data symbol and a phasor generation circuit configured to determine the first phasor based on the edge-detected data symbol and a target frequency.

In Example 135, the subject matter of Example 134 can optionally include wherein the encoding circuit, the decoding circuit, and the data bus are components of a transceiver device of the radio communication device.

In Example 136, the subject matter of Example 135 can optionally include wherein one or more of the plurality of target frequencies correspond to one or more reception frequencies associated with the transceiver device.

In Example 137, the subject matter of Example 135 can optionally include wherein one or more of the plurality of target frequencies correspond to a Global Navigation Satellite system receiving frequency associated with the transceiver device.

In Example 138, the subject matter of Example 134 can optionally include wherein the decision circuit is configured to select the encoded data symbol or the alternate data symbol as the transmit data symbol based on whether transmission of the encoded data symbol or the alternate data symbol will reduce a cumulative phasor over time at the target frequency.

In Example 139, the subject matter of Example 134 can optionally include wherein the decision circuit further includes an additional phasor generation circuit configured to determine a second phasor based on the edge-detected data symbol and an additional target frequency.

In Example 140, the subject matter of Example 139 can optionally include wherein the decision circuit is configured to select the encoded data symbol or the alternate data symbol as the transmit data symbol based on the first phasor and the second phasor.

In Example 141, the subject matter of Example 140 can optionally include wherein the decision circuit further includes a plurality of integrator circuits each configured to generate a first adjusted integral phasor and a second adjusted integral phasor based on the edge-detected data symbol and a respective target frequency of a plurality of target frequencies.

In Example 142, the subject matter of Example 134 can optionally include wherein the alternate symbol generation circuit is configured to invert bits at odd-numbered positions of the encoded data symbol.

In Example 143, the subject matter of Example 134 can optionally include wherein the decision circuit further includes an additional edge detection circuit configured to generate an additional edge-detected data symbol based on the encoded data symbol, an additional phasor generation circuit configured to determine a second phasor based on the additional edge-detected data symbol and an additional target frequency, wherein the decision circuit is configured to select the encoded data symbol or the alternate data symbol based on the first phasor and the second phasor.

In Example 144, the subject matter of Example 134 can optionally include wherein the phasor generation circuit is configured to determine the first phasor by determining a phasor of the edge-detected data symbol at the target frequency.

In Example 145, the subject matter of Example 134 can optionally include wherein the alternate symbol generation circuit includes at least one inverting circuit, and wherein the alternate symbol generation circuit is configured to generate the alternate data symbol by logically inverting at least one bit of the encoded data symbol.

In Example 146, the subject matter of Example 134 can optionally include wherein the alternate data symbol generation circuit includes a selection circuit configured to select the odd-numbered bits of the encoded data symbol, and an inverting circuit configured to logically invert the odd-numbered bits of the encoded data symbol.

In Example 147, the subject matter of Example 134 can optionally include wherein the phasor generation circuit is configured to determine a second phasor based on a further encoded data symbol and the target frequency, and wherein the decision circuit is configured to select the further encoded data symbol or a further alternate data symbol based on the second phasor.

In Example 148, the subject matter of Example 134 can optionally include wherein the decoding circuit is configured to receive a receive data symbol corresponding to the transmit data symbol over the data bus.

In Example 149, the subject matter of Example 148 can optionally include wherein the decoding circuit is configured to generate a decoded data symbol based on the receive data symbol.

In Example 150, the subject matter of Example 148 can optionally include wherein the decoding circuit is configured to generate a decoded data symbol as the receive data symbol or an inverted receive data symbol.

In Example 151, the subject matter of Example 150 can optionally include wherein the decoding circuit is configured generate a decoded data symbol as the receive data symbol or an inverted receive data symbol based on one or more encoding bits of the receive data symbol.

In Example 152, the subject matter of Example 148 can optionally include wherein the decoding circuit is configured to generate a decoded data symbol as the receive data symbol or an odd-bit inverted receive data symbol.

In Example 153, the subject matter of Example 152 can optionally include wherein the decoding circuit is configured generate a decoded data symbol as the receive data symbol or an odd-bit inverted receive data symbol based on one or more encoding bits of the receive data symbol.

In Example 154, the subject matter of Example 149 can optionally include wherein the decoding circuit includes at least one inverting circuit, and wherein the decoding circuit is configured to apply the at least one inverting circuit to invert one or more bits of the receive data symbol to generate the decoded data symbol.

Example 155 is a method for transmitting data over a data bus. The method includes generating an alternate data symbol based on an encoded data symbol scheduled for transmission over the data bus, generating a plurality of phasors based on the encoded data symbol and a plurality of target frequencies, and selecting the encoded data symbol or the alternate data symbol as a transmit data symbol for transmission over the data bus based on the plurality of phasors.

In Example 156, the subject matter of Example 155 can optionally further include performing an analysis on the plurality of phasors, and wherein the selecting the encoded data symbol or the alternate data symbol as a transmit data symbol for transmission over the data bus based on the plurality of phasors includes select the encoded data symbol or the alternate data symbol as the transmit data symbol based on the analysis.

In Example 157, the subject matter of Example 155 can optionally include wherein the selecting the encoded data symbol or the alternate data symbol as a transmit data symbol for transmission over the data bus based on the plurality of phasors includes selecting the encoded data symbol or the alternate data symbol as the transmit data symbol based on whether transmission of the encoded data symbol or the alternate data symbol will reduce a cumulative phasor over time at one or more of the plurality of target frequencies.

In Example 158, the subject matter of Example 155 can optionally include wherein the generating a plurality of phasors based on the encoded data symbol and a plurality of target frequencies includes generating each of the plurality of phasors by calculating the phasor of the encoded data symbol at a respective target frequency of the plurality of target frequencies.

In Example 159, the subject matter of Example 155 can optionally include wherein a first phasor of the plurality of phasors is the phasor of the encoded data symbol at a first target frequency of the plurality of target frequencies and a second phasor of the plurality of phasors is the phasor of the encoded data symbol at a second target frequency of the plurality of target frequencies.

In Example 160, the subject matter of Example 159 can optionally include wherein the selecting the encoded data symbol or the alternate data symbol as the transmit data symbol includes selecting the encoded data symbol or the alternate data symbol as the transmit data symbol based on the first phasor and the second phasor.

In Example 161, the subject matter of Example 155 can optionally further include performing edge detection on the encoded data symbol to generate an edge-detected data symbol.

In Example 162, the subject matter of Example 161 can optionally include wherein a first phasor of the plurality of phasors is the phasor of the encoded data symbol at a first target frequency of the plurality of target frequencies and a second phasor of the plurality of phasors is the phasor of the edge-detected data symbol at a second target frequency of the plurality of target frequencies.

In Example 163, the subject matter of Example 162 can optionally include wherein the first target frequency is substantially equal to the second target frequency.

In Example 164, the subject matter of Example 162 can optionally include wherein the first target frequency is different than the second target frequency.

In Example 165, the subject matter of Example 155 can optionally include wherein the generating an alternate data symbol based on the encoded data symbol includes generating the alternate data symbol by logically inverting at least one bit of the encoded data symbol.

In Example 166, the subject matter of Example 165 can optionally include wherein the alternate data symbol is the logical bitwise inversion of the encoded data symbol.

In Example 167, the subject matter of Example 155 can optionally include wherein each of the plurality of target frequencies corresponds to one or more radio frequency bands used to receive wireless signals.

In Example 168, the subject matter of Example 155 can optionally include wherein at least one of the plurality of target frequencies corresponds to a Global Navigation Satellite System receiving frequency.

In Example 169, the subject matter of Example 155 can optionally include wherein one or more of the plurality of phasors is the phasor of an edge-detected data symbol at the respective target frequency of the plurality of target frequencies.

In Example 170, the subject matter of Example 155 can optionally further include performing edge-detection on the encoded data symbol to generate a plurality of edge-detected data symbols.

In Example 171, the subject matter of Example 170 can optionally include wherein the generating a plurality of phasors based on the encoded data symbol and a plurality of target frequencies includes generating one or more of the plurality of phasors by determining the phasor of an edge-detected data symbol of the plurality of edge-detected data symbols at a respective target frequency of the plurality of frequencies.

Example 172 is a method for transmitting data over a data bus. The method includes generating an alternate data symbol based on an encoded data symbol scheduled for transmission over the data bus, generating an edge-detected data symbol based on the encoded data symbol, determining a first phasor based on the edge-detected data symbol and a target frequency, and selecting the encoded data symbol or the alternate data symbol as a transmit data symbol for transmission over the data bus based on the first phasor.

In Example 173, the subject matter of Example 172 can optionally include wherein the selecting the encoded data symbol or the alternate data symbol as a transmit data symbol for transmission over the data bus based on the first phasor includes selecting the encoded data symbol or the alternate data symbol as the transmit data symbol based on whether transmission of the encoded data symbol or the alternate data symbol will reduce a cumulative phasor over time at the target frequency.

In Example 174, the subject matter of Example 172 can optionally include wherein the determining the first phasor based on the edge-detected data symbol and a target frequency includes determining the first phasor by determining a phasor of the edge-detected data symbol at the target frequency.

In Example 175, the subject matter of Example 172 can optionally further include determining a second phasor based on the edge-detected data symbol and an additional target frequency.

In Example 176, the subject matter of Example 175 can optionally include wherein the selecting the encoded data symbol or the alternate data symbol as the transmit data symbol includes selecting the encoded data symbol or the alternate data symbol as the transmit data symbol based on the first phasor and the second phasor.

In Example 177, the subject matter of Example 172 can optionally include wherein the generating an alternate data symbol based on an encoded data symbol includes generating the alternate data symbol by logically inverting at least one bit of the encoded data symbol.

In Example 178, the subject matter of Example 177 can optionally include wherein the generating the alternate data symbol by logically inverting at least one bit of the encoded data symbol includes logically inverting bits at odd-numbered positions of the encoded data symbol to generate the alternate data symbol.

In Example 179, the subject matter of Example 172 can optionally include wherein the target frequency corresponds to a radio frequency band used to receive wireless signals.

In Example 180, the subject matter of Example 172 can optionally include wherein the target frequency corresponds to a Global Navigation Satellite System receiving frequency.

In Example 181, the subject matter of Example 172 can optionally further include generating an additional edge-detected data symbol based on the encoded data symbol, and determining a second phasor based on the additional edge-detected data symbol and an additional target frequency, wherein the selecting the encoded data symbol or the alternate data symbol as a transmit data symbol includes selecting the encoded data symbol or the alternate data symbol as a transmit data symbol based on the first phasor and the second phasor.

In Example 182, the subject matter of Example 172 can optionally further include determining a second phasor based on a further encoded data symbol and the target frequency, and selecting the further encoded data symbol or a further alternate data symbol as a further transmit data symbol based on the second phasor.

In Example 183, the subject matter of Example 182 can optionally further include generating the further alternate data symbol based on the further encoded data symbol.

In Example 184, the subject matter of Example 72 can optionally further include determining a second phasor at the target frequency based on a further encoded data symbol or a further edge-detected data symbol according to a mode control signal.

In Example 185, the subject matter of Example 184 can optionally further include selecting the further encoded data symbol or a further alternate symbol as a further transmit data symbol based on the second phasor.

In Example 186, the subject matter of Example 185 can optionally further include generating the further alternate data symbol based on the further encoded data symbol.

In Example 187, the subject matter of Example 185 can optionally further include generating the further edge-detected data symbol based on the further encoded data symbol.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An encoding circuit configured to select a transmit data symbol for transmission over a data bus comprising:
    an alternate symbol generation circuit configured to generate an alternate data symbol based on an encoded data symbol scheduled for transmission over the data bus; and
    a decision circuit configured to select the encoded data symbol or the alternate data symbol as the transmit data symbol based on a plurality of phasors, wherein the decision circuit comprises:
        a plurality of edge detection circuits configured to generate a plurality of edge-detected representations of the encoded data symbol; and
        a plurality of phasor generation circuits configured to generate the plurality of phasors based on the encoded data symbol and a plurality of target frequencies; and
        wherein each of the plurality of phasor generation circuits is configured to calculate a phasor of the encoded data symbol or the respective edge-detected representation of the plurality of edge-detected representations according to a mode control signal.

2. The encoding circuit of claim 1, wherein the decision circuit is configured to select the encoded data symbol or the alternate data symbol as the transmit data symbol based on whether transmission of the encoded data symbol or the alternate data symbol will reduce a cumulative phasor over time at one at one or more of the plurality of target frequencies.

3. The encoding circuit of claim 1, wherein a first phasor generation circuit of the plurality of phasor generation circuits is configured to generate a first phasor of the plurality of phasors by calculating the phasor of the encoded data symbol at a first target frequency of the plurality of target frequencies.

4. The encoding circuit of claim 3, wherein a second phasor generation circuit of the plurality of phasor generation circuits is configured to generate a second phasor of the plurality of phasors by calculating the phasor of the encoded data symbol at a second target frequency of the plurality of target frequencies.

5. The encoding circuit of claim 4, wherein the decision circuit is configured to select the encoded data symbol or the alternate data symbol as the transmit data symbol based on the first phasor and the second phasor.

6. The encoding circuit of claim 1, wherein the alternate symbol generation circuit comprises at least one inverting circuit, and wherein the alternate symbol generation circuit is configured to generate the alternate data symbol by logically inverting at least one bit of the encoded data symbol.

7. An encoding circuit configured to select a transmit data symbol for transmission over a data bus comprising:
   an alternate symbol generation circuit configured to generate an alternate data symbol based on the encoded data symbol scheduled for transmission over the data bus; and
   a decision circuit configured to select the encoded data symbol or the alternate data symbol as the transmit data symbol based on a first phasor,
   wherein the decision circuit comprises:
   an edge detection circuit configured to generate an edge-detected data symbol based on the encoded data symbol; and
   a phasor generation circuit configured to determine the first phasor based on the edge-detected data symbol and a target frequency; and
   wherein the phasor generation circuit is configured to calculate a phasor of the encoded data symbol or the edge-detected data symbol according to a mode control signal.

8. The encoding circuit of claim 7, wherein the decision circuit is configured to select the encoded data symbol or the alternate data symbol as the transmit data symbol based on whether transmission of the encoded data symbol or the alternate data symbol will reduce a cumulative phasor over time at the target frequency.

9. The encoding circuit of claim 7, wherein the decision circuit further comprises:
   an additional phasor generation circuit configured to determine a second phasor based on the edge-detected data symbol and an additional target frequency.

10. The encoding circuit of claim 9, wherein the decision circuit is configured to select the encoded data symbol or the alternate data symbol as the transmit data symbol based on the first phasor and the second phasor.

11. The encoding circuit of claim 7, wherein the alternate symbol generation circuit is configured to invert bits at odd-numbered positions of the encoded data symbol.

12. The encoding circuit of claim 7, wherein the decision circuit further comprises:
   an additional edge detection circuit configured to generate an additional edge-detected data symbol based on the encoded data symbol; and
   an additional phasor generation circuit configured to determine a second phasor based on the additional edge-detected data symbol and an additional target frequency,
   wherein the decision circuit is configured to select the encoded data symbol or the alternate data symbol based on the first phasor and the second phasor.

13. An encoding circuit configured to select a transmit data symbol for transmission over a data bus comprising:
   an alternate symbol generation circuit configured to generate an alternate data symbol based on an encoded data symbol scheduled for transmission over the data bus; and
   a decision circuit configured to receive the encoded data symbol and the alternate data symbol and further configured to select the encoded data symbol or the alternate data symbol as the transmit data symbol based on a first phasor and a second phasor of a plurality of phasors; wherein the decision circuit comprises:
   a plurality of edge detection circuits configured to generate a plurality of edge-detected representations of the encoded data symbol; and
   a plurality of phasor generation circuits configured to generate the plurality of phasors based on the encoded data symbol and a plurality of target frequencies; and
   wherein each of the plurality of phasor generation circuits is configured to calculate a phasor of the encoded data symbol or the respective edge-detected representation of the plurality of edge-detected representations according to a mode control signal.

14. The encoding circuit of claim 13, wherein the decision circuit is configured to select the encoded data symbol or the alternate symbol as the transmit data symbol based on the plurality of phasors.

15. The encoding circuit of claim 14, wherein a first phasor generation circuit of the plurality of phasor generation circuits is configured to generate the first phasor of the plurality of phasors by calculating the phasor of the encoded data symbol at a first target frequency of a plurality of target frequencies.

16. The encoding circuit of claim 15, wherein a second phasor generation circuit of the plurality of phasor generation circuits is configured to generate the second phasor of the plurality of phasors by calculating the phasor of the encoded data symbol at a second target frequency of the plurality of target frequencies.

17. The encoding circuit of claim 13, wherein the alternate symbol generation circuit comprises at least one inverting circuit,
   and wherein the alternate symbol generation circuit is configured to generate the alternate data symbol by logically inverting at least one bit of the encoded data symbol.

18. An encoding circuit configured to select a transmit data symbol for transmission over a data bus comprising:
   an alternate symbol generation circuit configured to generate an alternate data symbol based on the encoded data symbol scheduled for transmission over the data bus; and
   a decision circuit configured to determine a cumulative phasor at a target frequency from an edge-detected representation of the encoded data symbol and further configured to select the encoded data symbol or the alternate data symbol as the transmit data symbol based on whether transmission of the encoded data symbol or the alternate data symbol will reduce the cumulative phasor; wherein the decision circuit comprises:
   a plurality of edge detection circuits configured to generate a plurality of edge- detected representations of the encoded data symbol; and
   a plurality of phasor generation circuits configured to generate the plurality of phasors based on the encoded data symbol and a plurality of target frequencies; and
   wherein each of the plurality of phasor generation circuits is configured to calculate a phasor of the encoded data symbol or the respective edge-detected representation of the plurality of edge-detected representations according to a mode control signal.

19. The encoding circuit of claim 18, wherein the decision circuit is configured to select the encoded data symbol or the alternate data symbol as the transmit data symbol based on a first phasor, wherein the decision circuit comprises:
   an edge detection circuit configured to generate the edge-detected representation of the encoded data symbol; and a phasor generation circuit configured to determine the first phasor based on the edge-detected representation of the encoded data symbol and a target frequency.

20. The encoding circuit of claim 19, wherein the decision circuit further comprises:
a second phasor generation circuit configured to determine a second phasor based on the edge-detected data symbol and an additional target frequency.

21. The encoding circuit of claim 20, wherein the decision circuit is configured to select the encoded data symbol or the alternate data symbol as the transmit data symbol based on the first phasor and the second phasor.

22. The encoding circuit of claim 18, wherein the alternate symbol generation circuit is configured to invert bits at odd-numbered positions of the encoded data symbol.

23. The encoding circuit of claim 19, wherein the decision circuit further comprises:
a second edge detection circuit configured to generate a second edge-detected representation of the encoded data symbol; and
a second phasor generation circuit configured to determine a second phasor based on the second edge-detected representation of the encoded data symbol and an additional target frequency,
wherein the decision circuit is configured to select the encoded data symbol or the alternate data symbol based on at least one of the first phasor or the second phasor.

24. An encoding circuit configured to select a transmit data symbol for transmission over a data bus comprising:
an alternate symbol generation circuit configured to generate an alternate data symbol based on an encoded data symbol scheduled for transmission over the data bus; and
a decision circuit configured to determine a first cumulative phasor at a first target frequency from the encoded symbol, determine a second cumulative phasor at a second target frequency from an edge-detected representation of the encoded data symbol, and select the encoded data symbol or the alternate data symbol as the transmit data symbol based on whether transmission of the encoded data symbol or the alternate data symbol will reduce at least one of the first cumulative phasor or the second cumulative phasor; wherein the decision circuit comprises:
a plurality of edge detection circuits configured to generate a plurality of edge-detected representations of the encoded data symbol; and
a plurality of phasor generation circuits configured to generate the plurality of phasors based on the encoded data symbol and a plurality of target frequencies; and
wherein each of the plurality of phasor generation circuits is configured to calculate a phasor of the encoded data symbol or the respective edge-detected representation of the plurality of edge-detected representations according to a mode control signal.

25. The encoding circuit of claim 24, wherein each of the plurality of phasor generation circuits is configured to generate a respective phasor of the plurality of phasors based on the encoded data symbol and a respective frequency of the plurality of target frequencies.

26. The encoding circuit of claim 24, wherein the alternate symbol generation circuit comprises at least one logical inverter,
and wherein the alternate symbol generation circuit is configured to logically invert one or more bits of the encoded data symbol to generate the alternate data symbol based on the mode control signal.

27. The encoding circuit of claim 26, wherein the alternate symbol generation circuit is configured to logically invert every bit of the encoded data symbol to generate the alternate data symbol if the mode control signal indicates a first mode of operation.

28. The encoding circuit of claim 27, wherein the alternate symbol generation circuit is configured to logically invert every-other bit of the encoded data symbol to generate the alternate data symbol if the mode control signal indicates a second mode of operation.

29. The encoding circuit of claim 24, wherein at least one of the first or second target frequencies corresponds to a Global Navigation Satellite System receiving frequency.

* * * * *